(12) United States Patent
Philipsson et al.

(10) Patent No.: US 11,823,686 B2
(45) Date of Patent: Nov. 21, 2023

(54) METHODS, DEVICES AND COMPUTER PROGRAM PRODUCTS FOR LOSSLESS DATA COMPRESSION AND DECOMPRESSION

(71) Applicant: Audiodo AB, Malmö (SE)

(72) Inventors: John Philipsson, Södra Sandby (SE); Roger Martinson, Malmö (SE)

(73) Assignee: Audiodo AB, Malmö (SE)

( * ) Notice: Subject to any disclaimer, the term of this patent is extended or adjusted under 35 U.S.C. 154(b) by 199 days.

(21) Appl. No.: 17/595,229

(22) PCT Filed: May 22, 2020

(86) PCT No.: PCT/SE2020/050526
§ 371 (c)(1),
(2) Date: Nov. 11, 2021

(87) PCT Pub. No.: WO2020/242364
PCT Pub. Date: Dec. 3, 2020

(65) Prior Publication Data
US 2022/0223160 A1    Jul. 14, 2022

(30) Foreign Application Priority Data

May 24, 2019 (SE) .................................... 1950619-5

(51) Int. Cl.
*H03M 7/30* (2006.01)
*G10L 19/00* (2013.01)
*G10L 19/022* (2013.01)

(52) U.S. Cl.
CPC ........ *G10L 19/0017* (2013.01); *G10L 19/022* (2013.01)

(58) Field of Classification Search
CPC .............. G01L 19/0017; G01L 19/022; H03M 7/3044; H03M 7/3048; H04N 19/13
(Continued)

(56) References Cited

U.S. PATENT DOCUMENTS 7,363,225 B2    4/2008    Church et al.
7,411,528 B2    8/2008    Liebchen
(Continued)

FOREIGN PATENT DOCUMENTS

| CN | 102368385 A | 3/2012 |
|----|----|----|
| CN | 103746701 A | 4/2014 |
| CN | 107135004 A | 9/2017 |

OTHER PUBLICATIONS

International Search Report dated Aug. 9, 2020 in corresponding International Application No. PCT/SE2020/050526.
(Continued)

*Primary Examiner* — Peguy Jean Pierre
(74) *Attorney, Agent, or Firm* — Renner, Otto, Boisselle & Sklar, LLP

(57) ABSTRACT

A lossless data compression method that comprises the receiving of a series of data segments of a known length and a known characteristic and the pre-processing of the series of data segments to generate a series of differential data, which comprises a first value, one or more differential values and a last differential value. The method further comprises the dividing of the series of differential data into at least two blocks of differential data and the encoding of at least one block of differential data using Rice encoding, thereby providing at least one block of encoded differential data. In addition, the method comprises the generating of a data packet that comprises said at least one blocks of encoded differential data and any blocks of differential data not having been encoded. In addition, a lossless data decompression method, a portable electronic device for data compression, a portable electronic device for data decompression, a computer program product for data compression and a computer program product for data decompression is provided.

15 Claims, 11 Drawing Sheets

(58) Field of Classification Search
USPC .................................. 341/50, 76, 63, 65, 67
See application file for complete search history.

(56) References Cited

U.S. PATENT DOCUMENTS

| | | |
|---|---|---|
| 2006/0262858 A1 | 11/2006 | Ishikawa |
| 2006/0293899 A1 | 12/2006 | Church et al. |
| 2007/0262889 A1* | 11/2007 | Kuo ........................ H03M 7/40 |
| | | 341/51 |
| 2009/0048852 A1 | 2/2009 | Burns et al. |
| 2010/0023791 A1* | 1/2010 | Francescon ........... H04L 5/1484 |
| | | 713/375 |
| 2010/0027625 A1 | 2/2010 | Wik et al. |
| 2017/0330578 A1 | 11/2017 | Karimi-Cherkandi et al. |

OTHER PUBLICATIONS

Zhang, et al., "A New Data Compression Algorithm for Power Quality Online Monitoring," IEEE, 2009.
First Office Action dated Aug. 17, 2023, for Chinese Patent Application No. 202080036823.3.
Zhang Chao et al.; Application of Rice arithmetic based on two dimensional difference prediction in image data compression; Infrared and Laser Engineering; Feb. 2008; pp. 169-172; vol. 37, No. 1.

* cited by examiner

METHODS, DEVICES AND COMPUTER PROGRAM PRODUCTS FOR LOSSLESS DATA COMPRESSION AND DECOMPRESSION

This application is a national phase of International Application No. PCT/SE2020/050526 filed May 22, 2020, which claims priority to Sweden Application No. 1950619-5 filed May 24, 2019, the entire disclosures of which are hereby incorporated by reference.

TECHNICAL FIELD

The invention relates to data compression in general, and in particular to lossless data compression of series of data with known characteristics.

BACKGROUND

In modern society, where connected devices are becoming increasingly common, the need for fast and reliable communication is increasing. Much time and money is spent on increasing the overall throughput of data of wired or wireless devices paired with decreasing the latency of the communication between such devices. This teaches a user of communication services that response time should be fast and any action is expected to receive an immediate response. This is expected in all use cases from e.g. interaction with cellular phones to use a smart home solution to turn on the kitchen lights.

A particular area when the expected speed and response time causes problem is when a low speed control channel is used to control a high-speed data channel. This becomes apparent when portable electronic audio or video devices are switched between different use modes or software filters in the devices are updated. One example is when a wireless Bluetooth® audio headset is updated with a personalized hearing profile. The user will stream audio and seamlessly switch between using or not using a hearing profile or switching between different versions of a personalized hearing profile. The hearing profile will be transmitted to the audio headset using the control channel and the transfer will be slow, resulting in unwanted waiting time for the user, in some cases several seconds.

Typically, in cases as the example detailed above, a compression algorithm may be utilized in order to reduce the amount of data to transmit. The problem with compression algorithms are that they typically cause a loss of data, this is unacceptable with e.g. hearing profiles. Lossless compression algorithms will typically have poor performance, i.e. a compression factor below 25% caused in part by too much overhead, i.e. metadata, when compressing smaller datasets, less than 150 bytes of data, such as the mentioned hearing profiles.

One attempt at solving the abovementioned shortcomings is detailed in U.S. Pat. No. 7,363,225 where a list of integer values is generated from n-grams of a user input. The list of integer values is sorted. Differences between adjacent integer values in the list are calculated. Each calculated difference is encoded using a Golomb code. A Golomb compressed language model is accessed to identify likely matches.

One problem with the prior art is that the compression ratio, when applied to small sets of data, is still poor.

SUMMARY

An object of the present invention is to provide a new type of lossless data compression which is improved over prior art and which eliminates or at least mitigates the drawbacks discussed above. More specifically, an object of the invention is to provide a lossless data compression method that is efficient also on small data sets. One or more of these objects are achieved by the technique set forth in the appended independent claims with preferred embodiments defined in the dependent claims related thereto.

According to a first aspect, a lossless data compression method is provided. The method comprises receiving a series of data segments of a known length and a known characteristic and pre-processing of the series of data segments to generate a series of differential data, which comprises a first value, one or more differential values and a last differential value. The method further comprises dividing the series of differential data into at least two blocks of differential data and encoding at least one block of differential data using Rice encoding, thereby providing at least one block of encoded differential data. Also, the method comprises generating a data packet comprising said at least one block of encoded differential data and any blocks of differential data not having been encoded.

In one embodiment of the lossless data compression method, in the step of generating, the data packet further comprises one or more k-parameters. Each k-parameter is associated with a block of encoded differential data. Including the k-parameter in the data packet is beneficial since it allows the encoding to use any k-parameter since the k-parameter, in this embodiment, does not e.g. have to be known beforehand or recreated when decoding.

In a further embodiment of the lossless data compression method, the step of encoding further comprises Rice-encoding at least one block of differential data with an associated k-parameter. The k-parameter is determined by calculating an average number of bits of the differential values of the associated block of differential data. Using an average number of bits as the k-parameter is a very efficient way of quickly finding the optimal, or close to optimal, k-parameter for a block of differential data.

In another embodiment of the lossless data compression method, in the step of pre-processing, the series of differential data is generated by delta-coding the series of data segments one or more iterations. This is beneficial since it reduces the variance and the mean of the data and consequently allows for a more efficient encoding.

In a further embodiment of the lossless data compression method, in the step of generating, the data packet further comprises a delta-coding iteration indicator, indicating the number of times each of the differential values have been delta-coded. Including the delta-coding iteration indicator in the data packet enables the number of iterations to be chosen freely. This is due to the decoding not having to know the number of iterations beforehand since it is provided in the data packet.

In a further embodiment of the lossless data compression method, the delta-coding is repeated until the sum of absolute values of the differential values is minimized or is below a predefined or configurable average threshold. Iteratively delta encoding until the sum of absolute values is minimized or is below a threshold will provide an optimal or close to optimal, from an encoding perspective, series of differential data. This may be done without having to perform memory and resource consuming calculations such as variance or standard deviation.

In yet another embodiment of the lossless data compression method, in the step of dividing, one block of differential data contains only the last differential value and the differential values and the first value are comprised in at least one other block of differential data. By treating the last value differently, a more efficient encoding is possible since the last value will typically be of a different magnitude than the others. The difference in magnitude will affect the k-parameter and reduce the efficiency of the encoding.

In one embodiment of the lossless data compression method, the step of encoding comprises not encoding the block of differential data comprising the last differential value. This is beneficial since the last differential is of a different magnitude compared to the others. This means that a k-parameter of a block comprising the last value will be greatly affected by the last value and coding efficiency will be reduced. It is especially beneficial if the last differential value is the only value in one block of differential data since encoding of one single differential data element would require more overhead than the data encoding reduces the data element, resulting in a poor compression ratio.

In another embodiment of the lossless data compression method, the characteristics of the series of data segments is that of a digital FIR audio filter. Having the series of data segments describing a digital FIR audio filter is especially beneficial since these filters have certain known characteristics that enables especially efficient compression.

According to a second aspect, a lossless data decompression method for decompressing a data packet generated by the lossless data compression method is provided. The lossless data decompression method comprises extracting blocks of data from the data packet wherein at least one block of data is a block of encoded differential data, and decoding the at least one block of encoded differential data, thereby providing one or more blocks of differential data. The method also comprises appending the one or more blocks of differential data into one series of differential data comprising a first value, a series of differential values and a last differential value, and post-processing the series of differential data based on the first value to generate a series of data segments.

In one embodiment of the lossless data decompression method, the data packet further comprises one or more k-parameters. Each k-parameter is associated with a block of encoded differential data. The step of extracting comprises extracting said one or more k-parameters from the data packet, and the step of decoding further comprises decoding blocks of encoded differential data using their associated k-parameters. Including the k-parameter in the data packet is beneficial since it allows the encoding to use any k-parameter since the k-parameter, in this aspect, does not e.g. have to be known beforehand or recreated when decoding.

In another embodiment of the lossless data decompression method, the series of differential data comprised in the data packet was generated by delta-coding the series of data segments one or more times. Further, the step of post-processing comprises delta-decoding the series of differential data one or more times. This is beneficial since it reduces the variance and the mean of the data and consequently allows for a more efficient encoding.

In a further embodiment of the lossless data decompression method, the data packet comprises a delta-coding iteration indicator, which indicates the number of times each of the differential values in the data packet was delta-coded. Further to this, the step of extracting comprises extracting, from the data packet, the delta-coding iteration indicator, and the step of post-processing is performed the same number of times as indicated by the delta-coding iteration indicator. Including the delta-coding iteration indicator in the data packet enables the number of iterations to be chosen freely. This is due to the decoding not having to know the number of iterations beforehand since it is provided in the data packet.

In yet another embodiment of the lossless data decompression method, one block of differential data comprised in the data packet contains only the last differential value and the differential values are comprised in at least one other block of differential data of the data packet. Also, the step of extracting comprises extracting one block of data containing the last differential value and at least one other block of data comprising one or more differential values and the first value. By treating the last value differently, a more efficient encoding is possible since the last value will typically be of a different magnitude than the others. The difference in magnitude will affect the k-parameter and reduce the efficiency of the encoding.

In yet another embodiment of the lossless data decompression method, the block of differential data comprising the last differential value comprised in the data packet is not encoded. Further to this, the step of decoding is not applied to the block of data comprising the last differential value. This is beneficial since the last differential value is of a different magnitude compared to the others. This means that a k-parameter of a block comprising the last value will be greatly affected by the last value and coding efficiency will be reduced. It is especially beneficial if the last differential value is the only value in one block of differential data since encoding of one single differential data element would require more overhead than the data encoding reduces the data element resulting in a poor compression ratio.

According to a third aspect, a portable electronic device comprising a controller, a memory and a communications interface is provided. The controller is configured to retrieve a hearing profile adapted for a user from the memory and subject the hearing profile to the lossless data compression method of the first aspect to generate a data packet. The controller is further configured to transmit the data packet to a second portable electronic device via the interface.

According to a fourth aspect, a portable electronic device comprising a controller, a memory and a communications interface is provided. The controller is configured to receive a data packet via the communications interface and subject the data packet to the lossless data decompression method of the second aspect to generate a series of data segments. The controller is further configured to store the series of data segments to the memory as a hearing profile.

According to a fifth aspect, a computer program product is provided. The computer program product is configured to, when executed by a controller, perform the lossless data compression method of the first aspect.

According to a sixth aspect, a computer program product is provided. The computer program product is configured to, when executed by a controller, perform the lossless data decompression method of the second aspect.

BRIEF DESCRIPTION OF THE DRAWINGS

Embodiments of the invention will be described in the following; references being made to the appended diagrammatical drawings which illustrate non-limiting examples of how the inventive concept can be reduced into practice.

DETAILED DESCRIPTION OF EMBODIMENTS

Hereinafter, certain embodiments will be described more fully with reference to the accompanying drawings. The invention may, however, be embodied in many different forms and should not be construed as limited to the embodiments set forth herein; rather, these embodiments are provided by way of example so that this disclosure will be thorough and complete, and will fully convey the scope of the invention, such as it is defined in the appended claims, to those skilled in the art.

It should be mentioned that words and terms like size and length are used throughout this disclosure. These terms are clear from their context, e.g. the size of a series may be the number of element of the series and/or the total number of binary bits representing the series. The length of a series may mean the same thing as the size of a series. The skilled person will have no difficulty in understanding the difference, if any, between size and length or how the teachings of this disclosure are to be applied.

Figure 1:
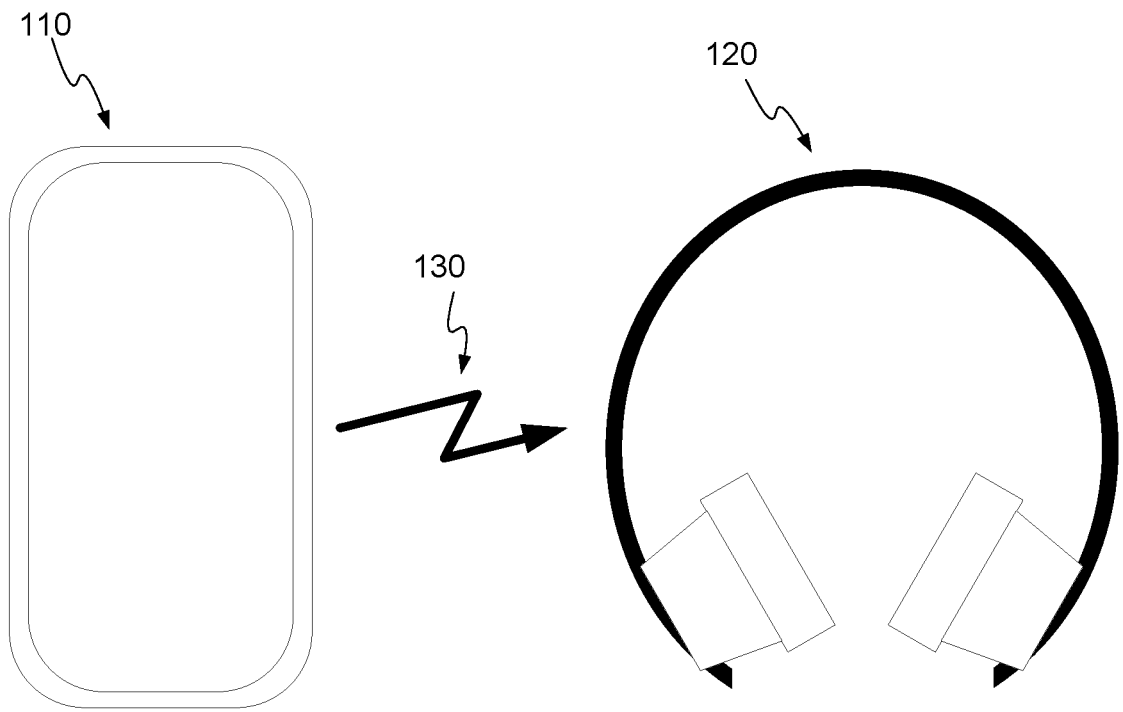
FIG. 1 is an overview of two portable electronic equipment in communication.

The disclosed invention relates to data compression in general, and lossless data compression of small amounts of data in particular. As a non-limiting example in order to present one application for the invention, consider the portable electronic equipment 120 depicted as a headset in FIG. 1 and the portable electronic equipment 110 depicted as a mobile phone in FIG. 1. The headset 120 and the mobile phone 110 are in communication with one another through an interface 130 that may be a Bluetooth interface but any suitable interface may be utilized. The mobile phone 110 is provided with a control application that connects to and controls at least part of the firmware of headset 120 over the interface 130. The control application may be configured to update a configuration relating to sound adjustments of the headset 120 while audio is being transferred from the mobile phone 110 to the headset 120 over the interface 130. Typically, if the interface 130 is e.g. Bluetooth, the audio data will be streamed on a streaming channel of the interface 130 and the configuration will be transferred on a data channel of the interface 130. This is a typical setup in many communication interfaces where the channels used or the bandwidth allocated to control and update a slave device is reduced compared to other interfaces used to e.g. stream data to the device. This makes sense since control commands typically are very short, even single bytes, and e.g. firmware upgrades and configuration updates of the slave device are rare and typically performed when the slave device is in standby or performed in the background without affecting use of the device. This means that even if the configuration to be transferred is small, for instance less than 150 bytes of data, the channel used for this is slow and transfer may take more than 3 seconds. If the configuration to be transferred is a hearing profile of a user of the headset 120 and the initiation of the transfer is done by the user on the mobile phone 130, a latency of 3 seconds is substantial. The user expects a close to instant feedback when switching between different configurations in order to directly evaluate the effect on the audio playback. The reverse scenario is also possible, wherein e.g. an audio profile is transferred from the headset 120 to the mobile phone 110. The straight forward approach, when the data rate of the interface 130 is fixed, is to use a standard lossless compression method such as Rice encoding of the data. In the non-limiting example above with the configuration comprising a hearing profile of less than 150 bytes, the data is compressed to approximately 85%, which still need more than 2.5 seconds of transfer time when switching configuration. Such a poor compression ratio does not motivate investing the computational power required to compress and decompress the data packet. Any added computational steps will consume power and reduce e.g. the standby time of portable electronic equipment. Reducing the size of the data will reduce the transfer time of the data and consequently the power consumption. This reduction has to be related to the computational cost and added power consumption of the compression and decompression. By utilizing the teachings of this disclosure, the data is compressed to an average of 46% of its original size. In the example above, if the sampling rate of the hearing profile is doubled, the correlation between the samples will increase and the skilled person will, after reading this disclosure, understand that the compression ratio will be even higher in such embodiments.

Figure 2A:
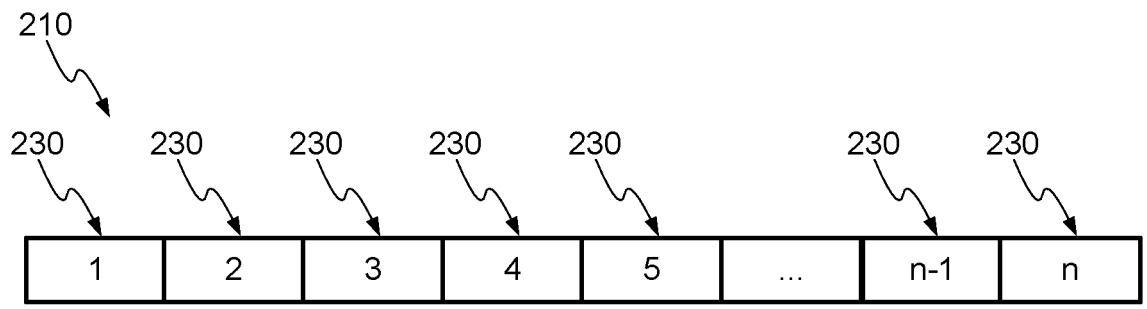
FIG. 2a is a schematic view of a series of data segments.
Figure 2B:
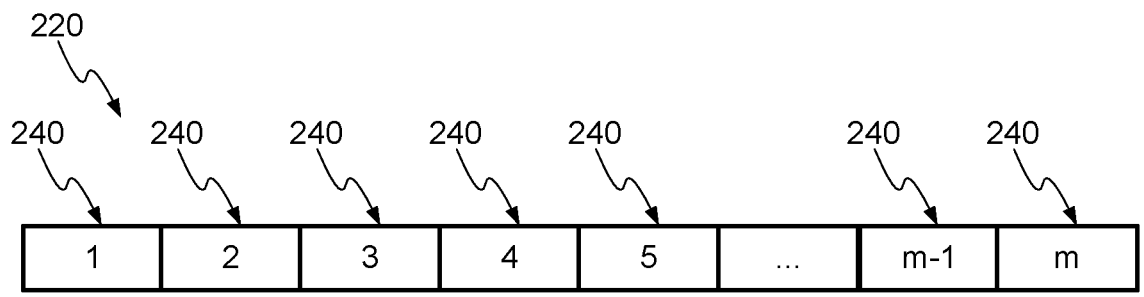
FIG. 2b is a schematic view of a data packet.

The data to be compressed, e.g. the configuration or audio profile in the example above, will be referred to as a series 210 of data segments and is depicted in FIG. 2a. The series 210 of data segments comprises a number n of data segments 230. In some embodiments of this disclosure, the data segments 230 contains 16 bits of data each. In some embodiments of this disclosure, the number n of data segments 230 is 32. However, it should be emphasized that the methods, modules and devices disclosed herein will work with any size or length of the series of data or data segments but that one of the benefits is the limited overhead or metadata required by the teaching herein. The longer the data series, the better the compression ratio, i.e. the invention works even better with larger series of data. The series 210 of data segments is transformed into a data packet 220, see FIG. 2*b*, that can be e.g. transferred, stored or transmitted and consequently received or retrieved and then transformed back into the original series 210 of data segments. The data packet 220 comprises a number m of output data segments 240. At least one of the output data segments 240 is encoded. The output data segments 240 may be any kind of data represented in a digital format and the methods and systems of the disclosed invention will be applicable to all of them.

In order to achieve lossless compression of small sets of data, the inventors behind this disclosure have skillfully combined a series of functions/modules that will be detailed in the following sections.

Figure 3:
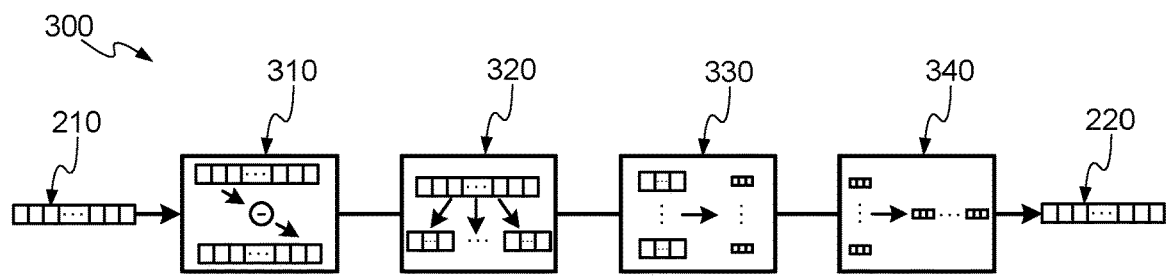
FIG. 3 is a block diagram of a data encoding system according to embodiments of the invention.

In FIG. 3, a data encoding system 300 is shown. The data encoding system 300 comprises a pre-processing module 310, a dividing module 320, an encoding module 330 and a generating module 340. The data encoding system 300 receives the series 210 of data segments and outputs the data packet 220.

Figure 4:
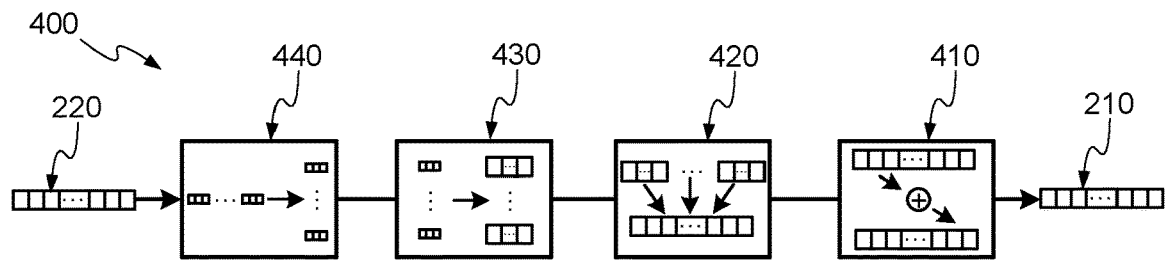
FIG. 4 is a block diagram of a data decoding system according to embodiments of the invention.

A corresponding system for decoding a data packet 220 is shown as a data decoding system 400 in FIG. 4. The data decoding system 400 comprises an extracting module 440, a decoding module 430, an appending module 420 and a post-processing module 410. The data decoding system 400 receives the data packet 220 and outputs the series 210 of data segments.

Each of the modules 310, 320, 330, 340, 440, 430, 420, 410 may be realized e.g. as computer implemented methods, using hardware components, a combination of hardware and software or in any other suitable manner. The specific function of each of the modules 310, 320, 330, 340, 440, 430, 420, 410 will be explained in further detail in the coming sections.

Pre-Processing and Post-Processing

The pre-processing module 310 has the task of preparing the series 210 of data segments received as input to the data encoding system 300 for further processing. Similarly, the post-processing module 410 receives a series of data provided by the appending module 420 and processes the series of data and provides the same series 210 of data segments as output, as the pre-processing module 310 received as input. In short, the process is lossless in that there is no difference in the series 210 of data segments output by the a data decoding system 400 and the series 210 of data segments received as input by the data encoding system 300.

Each data segment 230 of the series 210 of data segments is a number of binary bits. The number of bits, nb, in each data segment 230 will set the largest number representable by the data segment 230 as $2^{nb}-1$. For the sake of explanation only, consider a series 210 of data segments with data segments 230 of 8 bits ($2^8-=255$) but with the highest number represented by the series data segments 210 being 127, i.e. all numbers in the series are equal to or between 0 and 127. In this example, the data segments 230 can be reduced to 7 bits ($2^7-1=127$) without losing any data, assuming that it is known that 7 bits will be used for the data. Similarly, if the smallest number represented by the series of data segments is 128, i.e. all numbers in the series are equal to or between 128 and 255, this number can be subtracted from each of the data segments 230 of the series 210 of data segments resulting in a series 510 of differential data. After the subtraction, all numbers in the series are equal to or between 0 and 127. One effect of this is that the data segments 230 in this example can be reduced to 7 bits ($2^7-1=127$) without losing any information, assuming that the subtracted number (128) is known.

The later example given above can be seen as one way of delta coding data where a constant, 128 in the example above, is used to calculate the differences or deltas.

Figure 5:
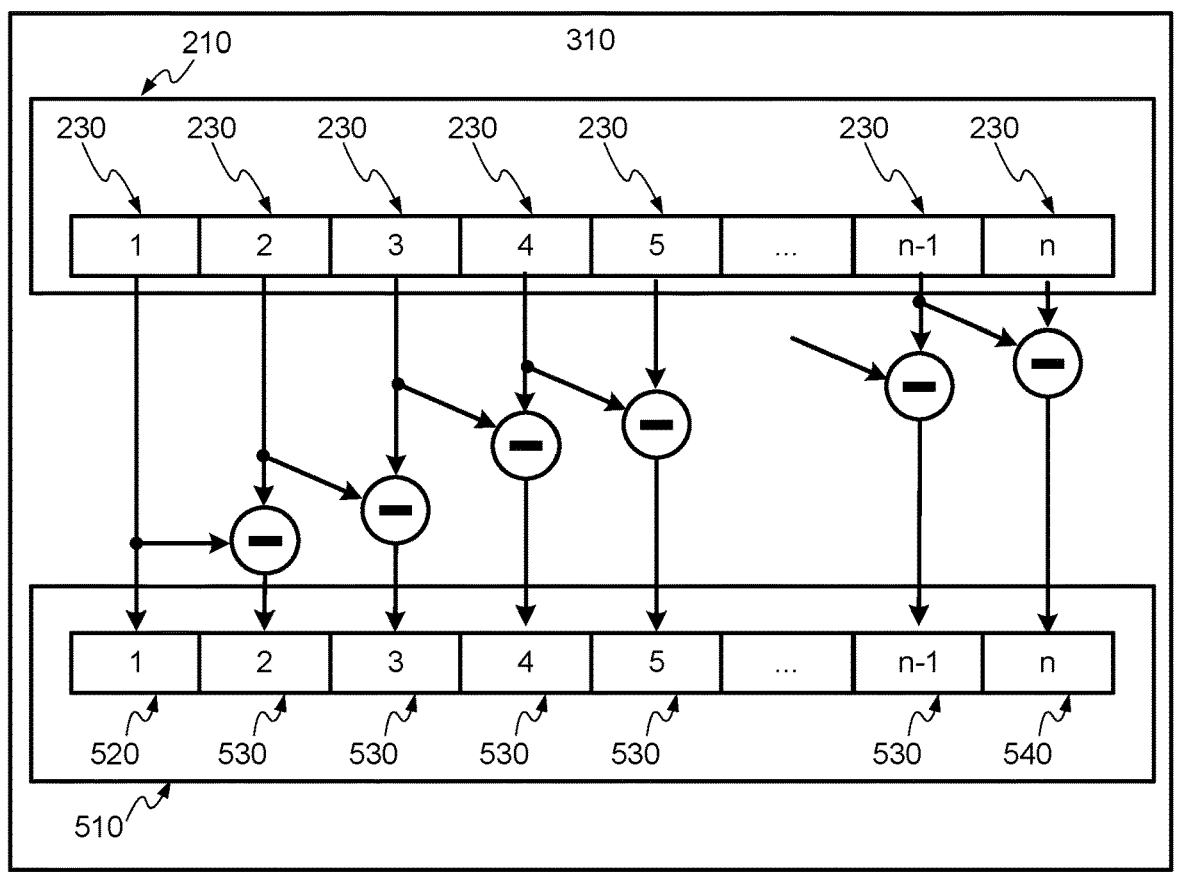
FIG. 5 is a schematic view of a pre-processing module according to embodiments of the invention.

In FIG. 5, one embodiment of the pre-processing module 310 is shown. The pre-processing module 310 receives the series 210 of data segments and generates a series 510 of differential data comprising a first value 520, a last differential value 540 and one or more differential values 530. A differential value 530 is typically calculated as the difference between the corresponding data segment 230 and another data segment 230. The other data segment 230 is typically a data segment 230 that is adjacent to the data segment 230 corresponding to the differential value in the series 210 of data segments. Referencing FIG. 5, the second differential value 530 is calculated as the difference between the first value 520, this may be value one in the series 210 of data segments, and the second data segment 230 in the series 210 of data segments. Similarly, the fifth differential value 530 is, in FIG. 5, calculated as the difference between the fifth input data segment 230 and the fourth input data segment 230. This process is continued until a last differential value 540 is calculated, the last differential value 540 being the difference between the last data segment 230 and the second last data segment 230.

The delta coding described with reference to FIG. 5 is but one example of how delta coding can be done. The term first value does not have to mean the first value in a series of values but may very well reference any value in a series of values. The first value 520 is the starting value that is used as reference when calculating the differential values 530. The first value 520, may very well be the last value of the series 210 of data segments and in some embodiments, this may be particularly beneficial. Similarly, the last differential value 540 may not be based on the difference between the last values of the series 210 of data segments but may be based on any data segments 230. The last differential value 540 merely indicates the last of the differential values 530, 540 in the series 510 of differential data. Treating the last differential value 540, or the first value 520, differently compared to the other differential values 530, as will be seen, may be beneficial. This is especially true if the series 210 of data segments has a characteristic wherein the data segments 230 at the end or beginning of the series 210 of data segments typically have a smaller absolute value compared to the data segments 230 at the opposite end of the series 210 of data segments. This opens up for reducing the number of bits representing the first value 520 and/or the last differential value 540 in the series 510 of differential data. Remember that the first value is not a calculated delta-value. Similarly, middle data segment 230 may be used as the first value 520 if the series 210 of data segments has characteristics wherein the middle data segments 230 are typically smaller than the other data segments 230 of the series 210 of data segments. The skilled person will, after fully digesting the teachings of this disclosure, understand how to choose the optimal first value 520 depending on characteristic of the series 210 of data segments.

Figure 6:
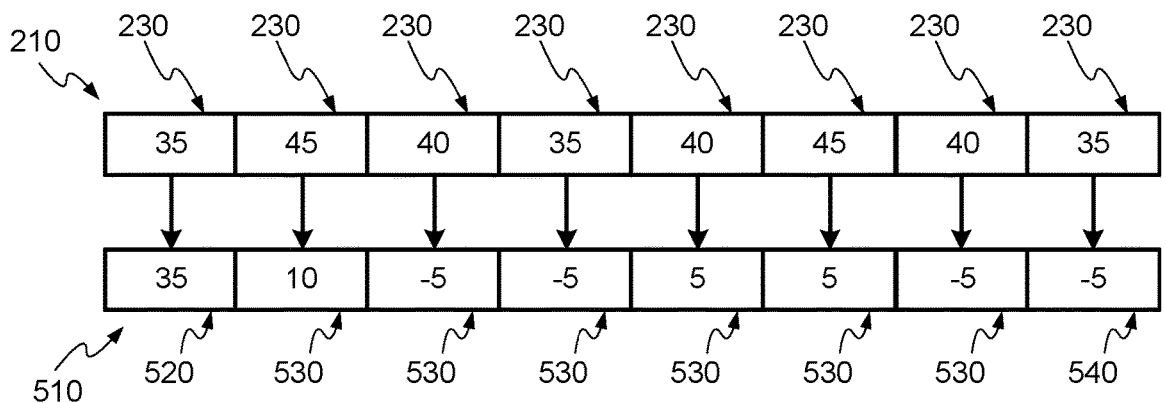
FIG. 6 is an exemplary view of steps of pre-processing according to embodiments of the invention.

Turning to FIG. 6 shows an example of what a series 510 of differential data may look like based on a series 210 of data segments provided as input to a pre-processing module 310. The leftmost data segment 230 of the series 210 of data segments is used as first value 520 in the series 510 of differential data. The first value 520 is subtracted from the second data segment in order to create the second differential value, in FIG. 6 this is 45-35=10. The subtraction may of course also be performed by subtracting the second data segment from the first value 520 creating a positive differential value in the example of FIG. 6. The third differential value is generated by subtracting the second data segment from the third data segment, in FIG. 6 this is 40-45=−5. The same subtractions are repeated for all data segments 230 of the series 210 of data segments. The series 210 of data segments shown in FIG. 6 contain the same numbers as will be used in the following embodiments further exemplifying delta-coding. These numbers are random and may not be suitable for all embodiments of the pre-processing module 310. These numbers are merely presented to explain the methodology by means of example.

Figure 7:
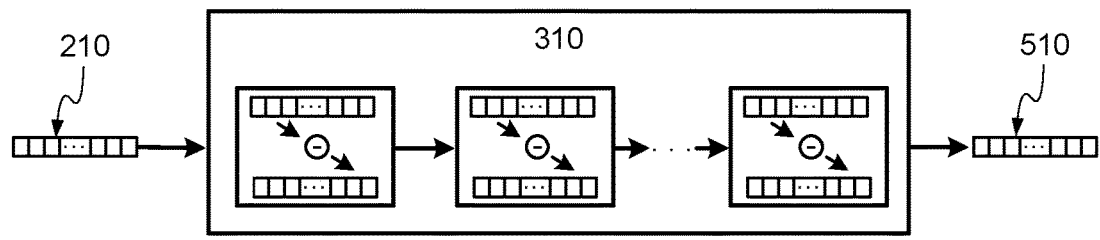
FIG. 7 is a block diagram of a pre-processing module according to embodiments of the invention.

In FIG. 7, an embodiment of the pre-processing module 310 is shown. In this embodiment, the delta-coding is repeated a plurality of times. The output from a first delta coding cycle is used as input to a second delta coding cycle and so on. This setup may further decrease the variance, the maximum absolute differential value, the sum of absolute differential values, the number of unique differential values and/or the average of the differential values. It should be mentioned that multiple repetition, iterations, cycles and multiple times in the concept of delta-coding is to means the same thing, i.e. the number of times the series 510 of differential data or part of the series 510 of differential data has been subjected to delta-coding.

In a further embodiment, the first value 520 from the first delta coding cycle is the same as the first value 520 used in the second delta-coding cycle. Basically, the same delta coding module is iterated a plurality of times using the series 210 of data segments as first input and then using the generated series 510 of differential data as input for the second iteration. This means that each delta coding cycle result is the same number of differential values. This is exemplified in FIG. 8 where two delta-coding cycles are shown.

Figure 9:
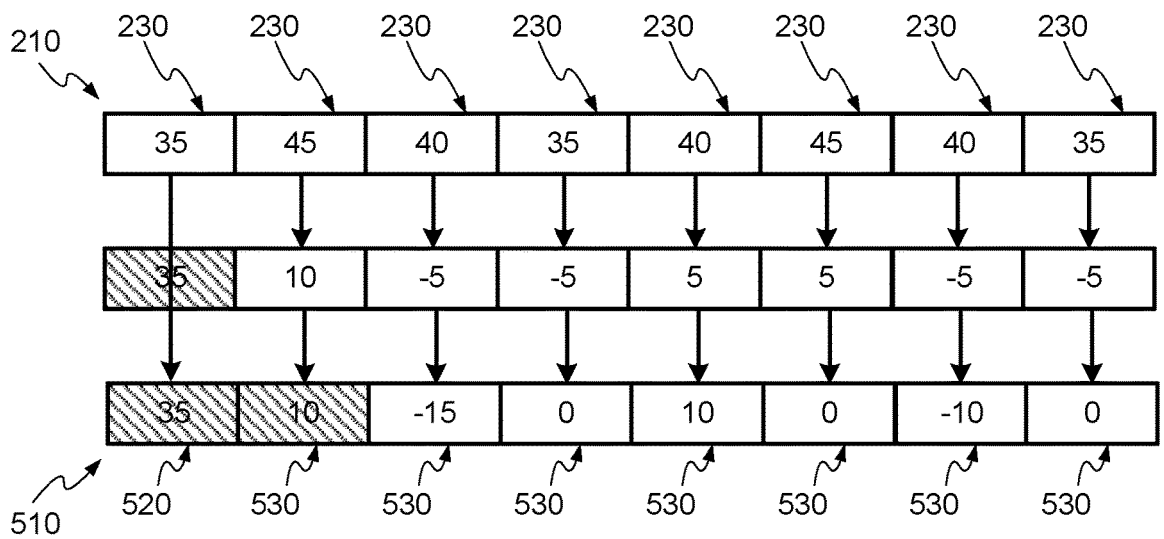
FIG. 9 is an exemplary view of steps of pre-processing according to embodiments of the invention.

In another further embodiment, exemplified in FIG. 9, each cycle uses a different first value and the value which has been used as first value in a previous iteration is ignored in the consecutive delta-coding iterations. In FIG. 9 this can be seen as the first differential value in the first iteration of the delta coding, i.e. 10, is used as first value for the second delta coding iteration. The first differential value, i.e. −15, that is output from the second iteration is the first value of the second iteration, i.e. the first differential value of the first iteration, subtracted from the second differential value of the first iteration, i.e. −5−10=−15.

Figure 8:
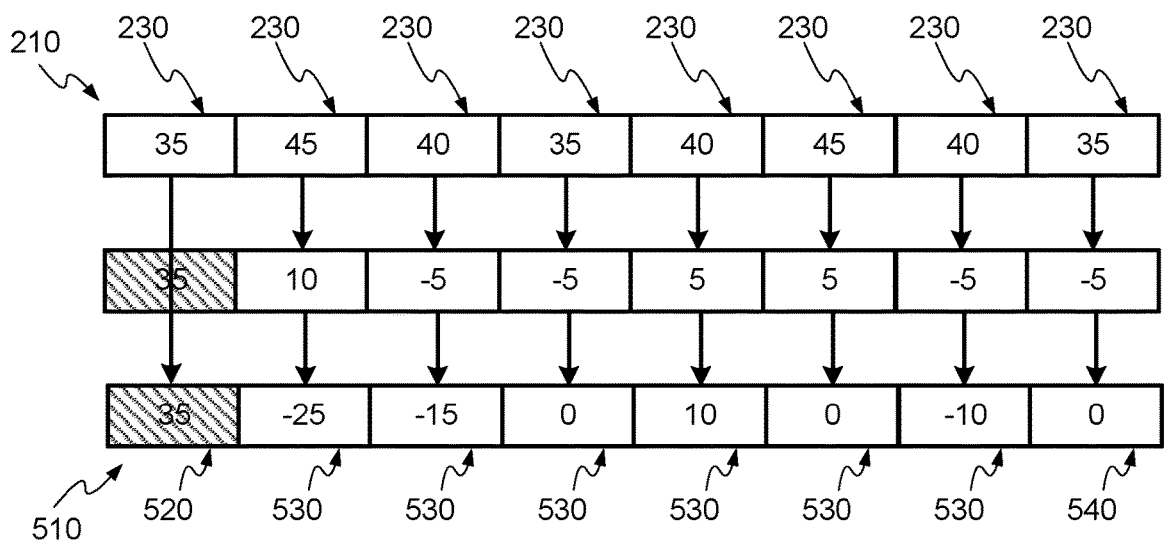
FIG. 8 is an exemplary view of steps of pre-processing according to embodiments of the invention.

The examples given with reference to FIGS. 8 and 9 both describe two iterations, this is for the sake of efficient disclosure only. In the embodiment relating to FIG. 8, the number of delta-coding cycles may be infinite and in the embodiment relating to FIG. 9 there could be as many delta-coding cycles as there are data segments 230 in the series 210 of data segments. It should also be mentioned that the embodiments mentioned may be combined and one of the embodiments could be executed for a first number of iteration and the other embodiment for a second number of iterations.

The inventors behind this disclosure have skillfully realized that there are a number of different ways of how to determine how many delta-coding iterations the pre-processing module 310 is to perform.

In one embodiment of the pre-processing module 310, the number of delta-coding iterations is a predetermined number of iterations. In a further embodiment, the number of times the series 210 of data segments is delta coded is between 2 and 10 times and in another embodiment, the number of times the series 210 of data segments is delta coded is between 3 and 7. In a further embodiment that is especially beneficial when delta coding audio profiles, the predetermined number of times the series 210 of data segments is delta-coded is 4 or 5 times. These numbers have been, by the inventors, empirically shown to be extra beneficial when subjecting an audio profile for a headset to the teachings of this disclosure.

In one embodiment of the pre-processing module 310, the number of delta-coding iterations is an adaptive number of iterations.

In a further embodiment, the pre-processing module 310 iterates the delta coding until the number of differential values 230 that are unique is minimized. One way of implementing this is to count the number of differential values 230 that are unique in each iteration. Once the number of differential values 230 that are unique is increased compared to a previous iteration, the pre-processing is stopped and the series 510 of differential data provided as output from the pre-processing module is the series 510 of differential data generated from the previous iteration. Alternatively, the pre-processing module 310 iterates the delta coding until the number of differential values 230 that are unique is below a predefined or configurable unique value threshold.

In another embodiment, the pre-processing module 310 iterates the delta coding until the sum of the absolute values of the differential values is minimized. One way of implementing this is to sum up the absolute values of the differential values 230 in each iteration. Once the sum of the absolute values of the differential values is increased compared to a previous iteration, the pre-processing is stopped and the series 510 of differential data provided as output from the pre-processing module is the series 510 of differential data generated from the previous iteration. Alternatively, the pre-processing module 310 iterates the delta coding until the sum of the absolute values of the differential values is below a predefined or configurable absolute value threshold. Looking at the sum of differential values when determining the number of times the delta-coding should be cycled is extra beneficial when limited resources are available to do the delta-encoding, e.g. in a mobile phone, headset or other portable electronics equipment with limited processing power, memory, battery etc.

In yet another embodiment, each delta-coding iteration performed by the pre-processing module is subjected to all the modules 320, 330, 340 of the data encoding system 300 unit the size of the data packet 220 is minimized. As in the foregoing embodiments, this may be accomplished by calculating the size of each data packet generated from each iteration of delta-coding of the series 210 of data segments. Once the size of the data packet 220 is increased compared to the size of the data packet from a previous delta-coding iteration, the pre-processing is stopped and the series 510 of differential data provided as output from the pre-processing module 310 is the series 510 of differential data generated from the previous iteration. Of course, since all the modules 320, 330, 340 have been executed, the data packet 220 from the previous delta coding iteration could be provided as output from the data encoding system 300. Alternatively, the pre-processing module 310 iterates the delta coding until the size of the data packet 220 is below a predefined or configurable data packet size threshold.

The skilled person will realize that the embodiments of the pre-processing module 310 listed above may very well be combined in a combined embodiment. In such embodiment, a sum of weights relating to the performance of each embodiment per iteration can be generated for each iteration. The pre-processing module 310 may continue to iterate delta-coding cycles until e.g. the sum of weights is minimized. As mentioned above, this may be implemented by stopping the iteration when a current sum of weights is larger than a previous sum of weights and the series 510 of differential data provided as output from the pre-processing module 310 is the series 510 of differential data generated from the previous iteration. Alternatively, the pre-processing module 310 iterates the delta coding until the sum of weights is below a predefined or configurable data packet size threshold.

The embodiments given above may, where applicable, be executed, either until a stop criteria as mentioned in relation to each embodiment is fulfilled, or for a maximum number of times. The maximum number of times may be a configurable or predefined maximum number of times. If the pre-processing is run for the maximum number of times, the series 510 of differential data provided as output from the pre-processing module 310 may be the series 510 of differential data generated from the iteration resulting in the best value used for the stop criteria of that particular embodiment. In a further embodiment, the maximum number of times is 6 times.

Similarly and/or additionally, a minimum number of iterations may be specified in some embodiments, i.e. the stop criteria may be ignored for a minimum number of iterations before any evaluation of the result is done.

Embodiments may further, where applicable, run for a fixed number of iterations and the series 510 of differential data provided as output from the pre-processing module 310 may be the series 510 of differential data generated from the last iteration of the fixed number of iterations. The fixed number of iteration may be a configurable or predefined fixed number of iterations.

Figure 10:
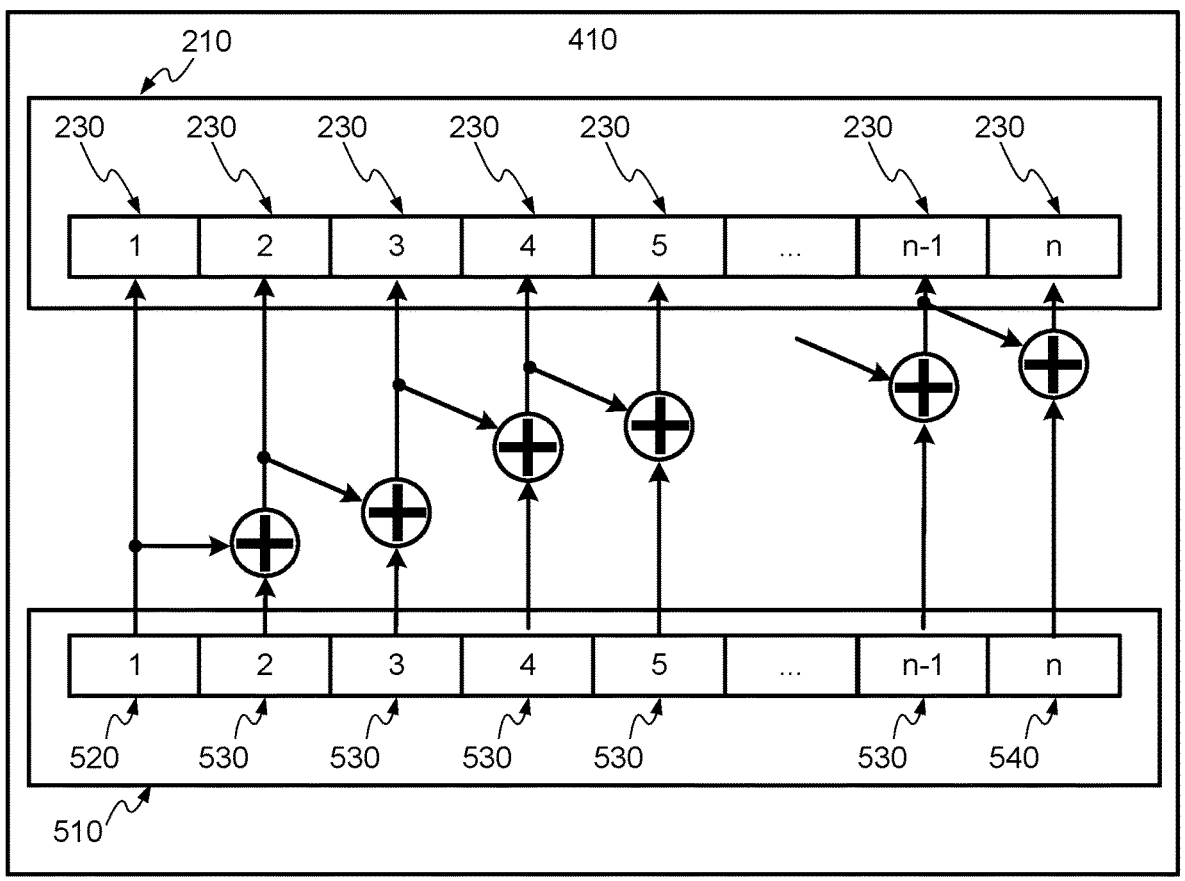
FIG. 10 is a schematic example of a post-processing module according to embodiments of the invention.

With reference to FIG. 10, an embodiment of the post-processing module 410 will be explained. The post-processing module 410 works much like the pre-processing module 310 but in reverse. The post-processing module 410 receives a series 510 of differential data comprising a first value 520 and one or more differential values 530, 540. The series 510 of differential data is processed such that the series 210 of data segments provided to the pre-processing module 310 is recreated. In FIG. 10, the first value 520 in the series 510 of differential data becomes a first data segment 230 in the series 210 of data segments, i.e. the leftmost data segment 230 in the series 210 of data segments shown in FIG. 10. The first value 530 is added to the first differential value 530 of the series 510 of differential data providing a second data segment 230 in the series 210 of data segments. This second data segment 230 is added to the second differential value 530 in the series 510 of differential data providing the third data segment 230 in the series 210 of data segments, i.e. the third data segment 230 in the series 210 of data segments shown in FIG. 10. This is repeated for all differential values 530, 540 in the list of differential data 510 provided to the post-processing module 410. After processing of the last differential value 540 in the list of differential data 510, the list of data segments 210 provided from the post-processing module 410 contains the same data as the list of data segments 210 provided to the corresponding pre-processing module 310. The post-processing module 410 may be described as delta-decoding data.

The post-processing module 410 will require information of the how the series 510 of differential data is organized and configured. This information may be provided to the post-processing module in a number of different ways, such as e.g. through control bits in the data packet 220, through any other controls provided to post-processing module 410, by pre-configuration and/or by analyzing the series 510 of differential data.

Figure 11:
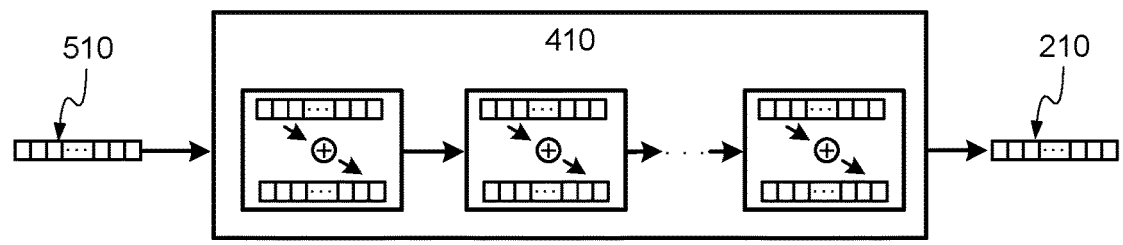
FIG. 11 is a block diagram of a post-processing module according to embodiments of the invention.

With reference to FIG. 11, a further embodiment of the post-processing module will be described. Analogously to the pre-processing module 310, the post-processing module 410 may run more than one iteration of the delta-decoding. The post-processing module 410 will require information as to how many iterations of the delta-decoding that should be performed and this information may be provided through any of the means mentioned earlier or any other suitable means for conveying this information to the post-processing module 410.

Figure 12:
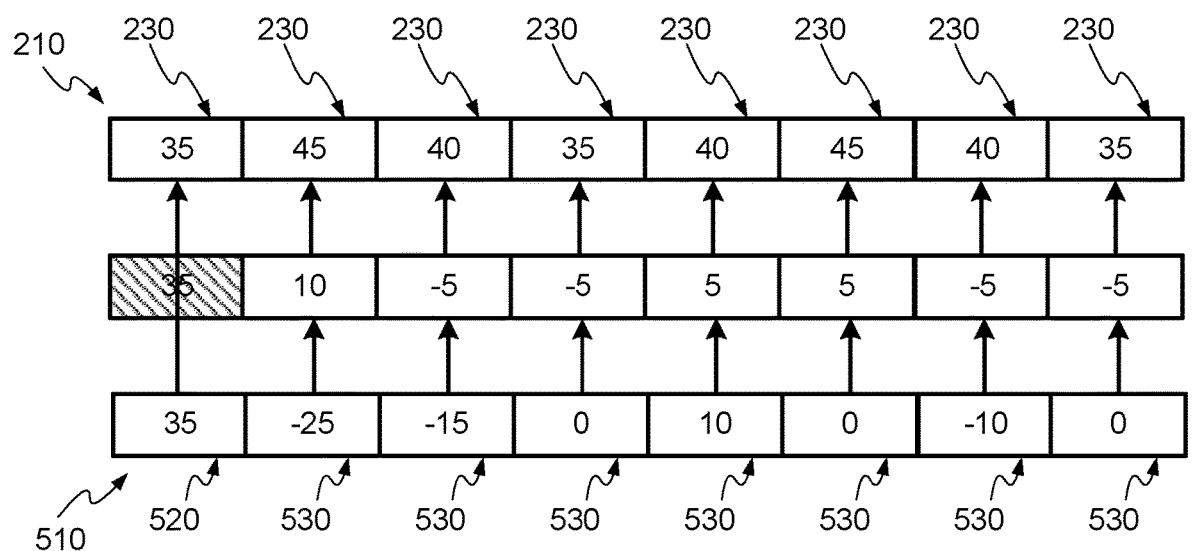
FIG. 12 is an exemplary view of steps of post-processing according to embodiments of the invention.

The steps of post-processing data in more than one iteration that has been pre-processed in more than one iteration is exemplified in FIG. 12. The example is the reverse of that presented with reference to FIG. 8. The skilled person will have no problem performing post-processing with more than one delta-decoding iteration after reading this disclosure and referencing the description given in relation to the pre-processing module 310 and the details regarding post-processing given in relation to FIGS. 10-12.

Dividing and Appending

Figure 13:
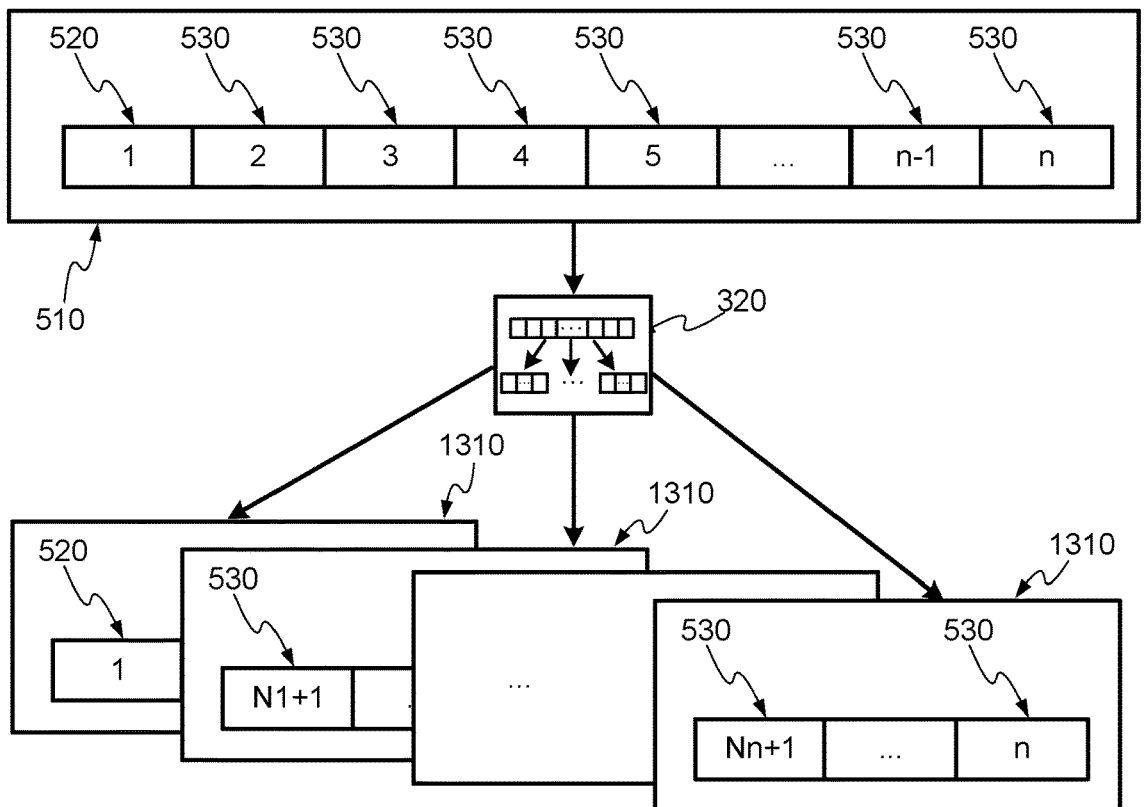
FIG. 13 is a block diagram of a dividing module according to embodiments of the invention.

As schematically depicted in FIG. 13, one embodiment of the dividing module 320 receives the series 510 of differential data from the pre-processing module 310 and divides the differential data 510 into at least two blocks 1310 of differential data that are provided to the encoding module 330. The blocks 1310 of differential data may all be of the same length but may very well be of different lengths or have some blocks 1310 of differential data with the same length and others blocks 1310 of differential data with different lengths. Note that the some blocks 1310 of differential data may contain only differential data 530, 540 but at least one of the blocks 1310 of differential data also comprises the first value 520 which is not a differential value per say. Naturally, one of the blocks of differential data comprises the last differential value 540.

The purpose of the dividing module 320 is to split the series 510 of differential data into blocks 1310 of differential data such that the blocks of differential data correlate to the characteristic of the series 210 of data segments and consequently to the characteristic of the series 510 of differential data. The characteristic of the series 210 of data segments may be such that there is a higher variance at the beginning of the series 210 of data segments compared to a variance at the end of the series 210 of data segments. The opposite scenario may of course also be considered. In either way, in view of the encoding that the blocks 1310 of differential data will be subjected to, it makes sense to have as similar variance as possible within the block 1310 of differential data. Alternatively or additionally, the blocks 1310 of differential data may have as similar differential values 530 as possible, i.e. as low number of unique values as possible within the block.

In one embodiment of the dividing module 320, the number of blocks 1310 of differential data is a predefined or configurable number. In a further embodiment, the number of blocks 1310 of differential data is 4. This has been shown to be an especially beneficial number of blocks when subjecting audio profile for use in a headset to the teachings of this disclosure. This is the result from empirical studies performed by the inventors of this invention.

In one embodiment of the dividing module 320, the blocks 1310 of differential data has a predefined or configurable length, i.e. a predefined or configurable number of differential values 530.

In one embodiment of the dividing module 320, one block 1310 of differential data has a length of one, i.e. the block only contains one value. In a further embodiment, the block 1310 of differential data with a length of one contains the first value 520 or the last differential value 540.

Since length of the series 510 of differential data is known, and the objective of the dividing module 320 is to size optimize the data packet 220 to be generated, adaptively determining the number of blocks and/or the length of each block will add overhead. This is because the data decoding system 400 will require this information in order to successfully append data in its appending module 420. This may typically be achieved by having a length indicator associated with at least one of the blocks 1310 of differential data and/or a block indicator indicating the number of blocks, comprised in the data packet 220. With this said, the skilled person will realize that the following embodiments are best paired with e.g. a minimum length of each block 1310 of differential data, a maximum length of each block 1310 of differential data, a minimum number of blocks 1310 of differential data and/or a maximum number of blocks 1310 of differential data. The previously listed maximums and minimums may be predefined, configurable or adapted through an iterative machine learning process.

In one embodiment, the length of each block 1310 of differential data and/or the number of blocks differential data 1310 is adaptively determined.

In a further embodiment, the length of each block 1310 of differential data and/or the number of blocks of differential data is adaptively determined by minimizing the variance within the respective blocks 1310 of differential data.

In another further embodiment, the length of each block 1310 of differential data and/or the number of blocks of differential data is adaptively determined by minimizing the number of unique values within each block 1310 of differential data.

In yet another further embodiment, the length of each block 1310 of differential data and/or the number of blocks of differential data is adaptively determined by having different predefined of configurable target values for the mean value of the absolute values of the differential values 530 within each block 1310 of differential data.

In another further embodiment, the length of each block 1310 of differential data and/or the number of blocks of differential data is adaptively determined by calculating a sliding mean and a sliding variance across a number of differential data values 530. When the sliding mean and a sliding variance is above or below a predefined or configurable sliding mean and sliding variance threshold, the preceding differential data values 530 are added to a block 1310 of differential data. This means that each block 1310 of differential data will have certain expected confidence interval for its differential values 1310.

In a preferred embodiment that is very well suited for lossless compression of e.g. an audio profile, the number of blocks of differential data is four. One block 1310 of differential data has a length of one. The block 1310 of differential data that has a length of one contains the last differential value 540. This has been shown to be an especially beneficial number of blocks when subjecting audio profile for use in a headset to the teachings of this disclosure.

The audio profile is such that the last differential value 540 will be significantly different from a second to last differential value which means that encoding of the blocks will be more efficient. This will be shown in more detail in relations to examples given later in this disclosure.

Figure 14:
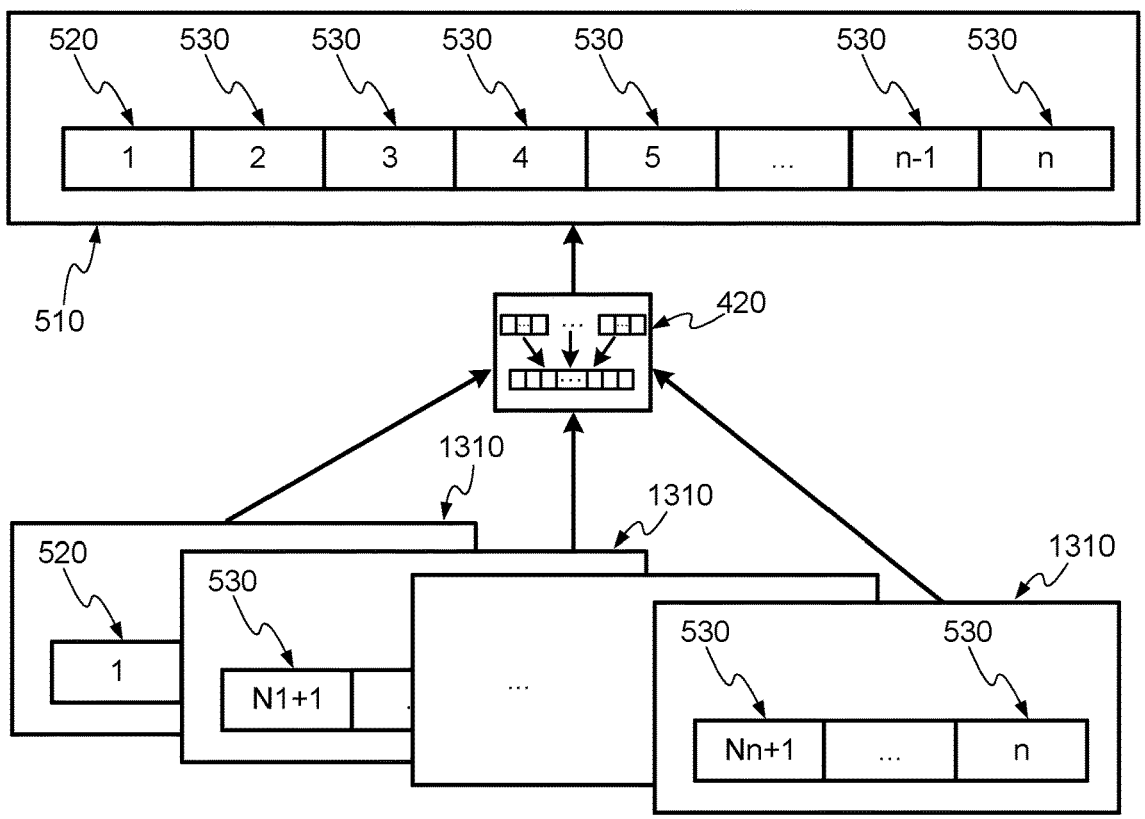
FIG. 14 is a block diagram of an appending module according to embodiments of the invention.

For the sake of completeness, a schematic overview of one embodiment of the appending module 420 is shown in FIG. 14. The appending module 420 receives blocks 1310 of differential data provided by e.g. the decoding module 430 and reverses the process of the dividing module 320. If necessary, the decoding module 430 is provided with, or acquires, information relating to the number of and/or length of blocks of differential data. Either the information may be predefined or configurable, alternatively or additionally, the information may be extracted as the block indicator and/or the length indicator from the data packet 220.

Encoding and Decoding

Figure 15:
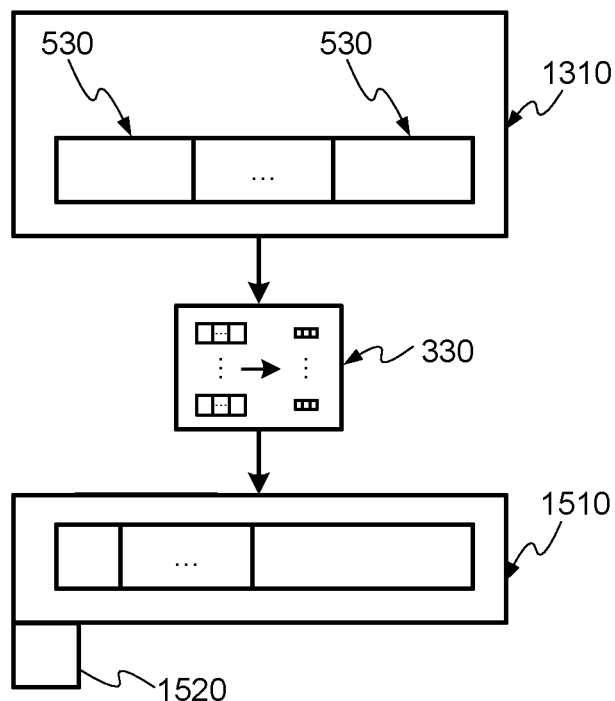
FIG. 15 is a schematic view of an encoding module according to embodiments of the invention.

Schematically shown in FIG. 15, the encoding module 330 is provided with one or more blocks 1310 of differential data from e.g. the dividing module 320 and provides one or more blocks 1510 of encoded differential data to e.g. the generating module 340. Each of the one or more blocks 1510 of encoded differential data is associated with a k-parameter 1520.

In embodiments of the encoding module 330, the encoding is performed by Rice coding or Rice encoding of at least some of the blocks 1310 of differential data. For the sake of completeness and briefly, Rice coding of data is known from the art and is a form of Golomb coding adapted for binary encoding. Rice coding uses k-parameters 1520 when encoding a data series and a number x is encoded by setting $m=2^k$. There are different methodologies for encoding but just as an example let q be the floor function of x/m and start with q binary ones, append a binary zero followed by the remainder of the fraction, i.e. x-q, binary encoded with k bits. Note that the opposite implementation with q binary zeroes and appending a binary one is also possible. This is repeated for a number of k-parameters and the k-parameter 1520 resulting in the shortest, i.e. smallest, block 1510 of encoded differential data is provided as output to the generating module 340 together with the selected k-parameter 1520.

From the short description of the Rice algorithm above, it is evident that a smaller k-parameter 1520 is more efficient on sets of data with low values and higher k-parameters 1520 is more efficient on sets of data with high values.

Typically, with the series 210 of data segments comprising an audio profile, the blocks 1310 of differential data provided to the encoding module 330 will have different variance. This means that delta coding and dividing an audio profile into blocks 1310 of differential data before encoding using Rice coding is especially beneficial. Having the possibility to use different k-parameters 1520 for different blocks of differential data 1310 will enable an optimal, or close to optimal k-parameter 1520 to be chosen separately for the blocks of differential data 1310 to be encoded. The audio profile typically has characteristics that result in the mean values of a delta-coded audio profile is different for different parts (blocks) of the audio profile. Similarly, the same reasoning can be applied to any series 210 of data segments with a known characteristic.

In one embodiment of the encoding module 330, at least one of the blocks 1310 of differential data provided to the encoding module 330 is encoded using Rice encoding with a predefined or configurable k-parameter 1520.

In one embodiment of the encoding module 330, at least one of the blocks 1310 of differential data provided to the encoding module 330 is encoded using Rice encoding and the encoding module 330 provides one k-parameter 1520 per block 1510 of encoded differential data.

In a further embodiment of the encoding module 330, the encoding module 330 calculates an average number of bits of the differential values 530, 540 for the respective blocks 1310 of differential data provided to the encoding module 330. The calculated average number of bits is rounded to its closest integer part and this rounded average number of bits is used as the k-parameter 1520 for encoding the block 1310 of differential data associated with the rounded average number of bits. This embodiment only requires simple averaging of the number of bits and no full encoding of the block 1310 of differential data is required in order to determine the optimal, or close to optimal, k-parameter 1520. This has been realized by the insightful inventiveness of the inventors from studying the Rice algorithm of the art and adapting the implementation to make it as efficient, both from processing cost and from current consumption, as possible.

In another further embodiment of the encoding module 330, the Rice-encoding algorithm is run a plurality of times for each block 1310 of differential data to be encoded with different k-parameters 1520 and the k-parameter 1520 resulting in the shortest compressed block 1510 of differential data is provided as output of the encoding module 330 together with its associated k-parameter 1520. This may be implemented by stopping the iteration when a current length of the block 1510 of encoded differential data is larger than the length of a previous encoding of the same block 1310 of differential data with a previous k-parameter and provided as output from the encoding module 330 is the block 1510 of encoded differential data generated from the previous iteration paired with its associated k-parameter 1520.

In further embodiments of the encoding module 330, the Rice-encoding is run iteratively with different k-parameters 1520 for a configurable or predetermined maximum number of encodings. Provided as output from the encoding module 330 is the shortest block 1510 of encoded differential data and its associated k-parameter 1520.

In any embodiment of the encoding module 330, at least one of the blocks 1310 of differential data provided to the encoding module 330 may be encoded using Rice encoding with a predefined or configurable k-parameter 1520.

In any embodiment of the encoding module 330, the block 1310 of differential data comprising the first value 520 may not be encoded. Additionally or alternatively, in any embodiment of the encoding module 330, block 1310 of differential data 0 comprising the last differential value 540 may not be encoded. As an alternative embodiment of the encoding module 330, the block 1310 of differential data comprising the first value 520 and/or the block 1310 of differential data comprising the last differential value 540 may be encoded using a predetermined or configurable k-parameter 1520. Having the block 1310 of differential data comprising the first value 520 and/or the last differential value 540 treated separately is beneficial since the first value 520 and/or the last differential value 540 is typically different and in many cases larger than the differential values 530. This means that a k-parameter 1520 suitable for differential values 530 adjacent to the first value 520 or adjacent to the last differential value 540 may not be suitable for the first value 520 and/or the last differential value 540 and the overall compression ratio may be reduced.

Figure 16:
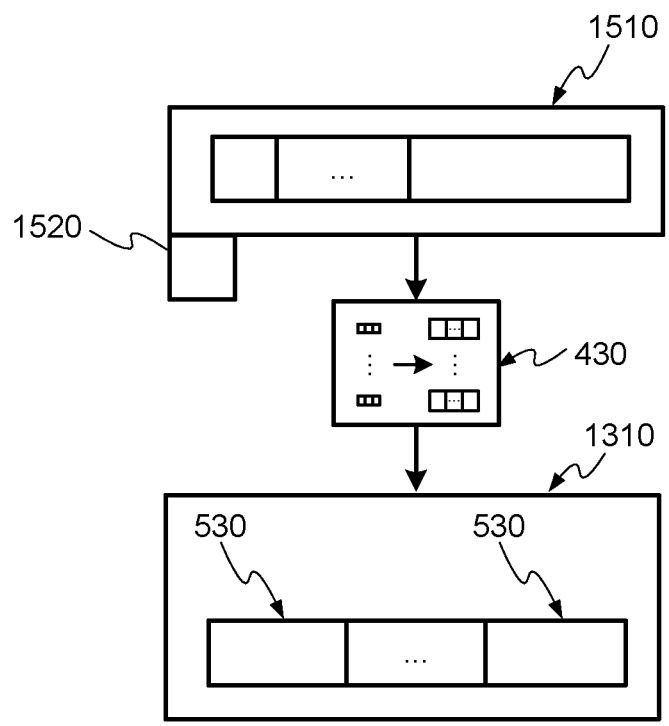
FIG. 16 is a schematic view of a decoding module according to embodiments of the invention.

From the description of the encoding module 330 given above, the decoding module 430 can be described as the reverse of the encoding module 330, as is shown schematically in FIG. 16. The decoding module 430 receives one or more blocks 1510 of encoded differential data and, if not predetermined, a k-parameter 1520 associated with each of the one or more blocks 1510 of encoded differential data. The decoding module 430 uses the k-parameter 1520 to decode an associated block 1510 of encoded data by Rice decoding. In short, extract the first fraction (x-q) by extracting the last k bits of the block 1510 of encoded data. Ignore a binary zero and extract q binary ones and the differential value 530 is decoded as q+fraction. This is repeated until the end of the block 1510 of encoded data.

Generating and Extracting

With reference to FIGS. 17a-e, a data packet 220 generated by the generating module 340 will be explained. The order of the data presented in the referenced Figs. is for exemplary purposes only, the order of the data in the data packet 220 is not important for the purpose of this invention. The Generating module 340 receives blocks 1510 of encoded differential data from the encoding module 330, in some embodiments, together with the associated k-parameters 1520. The phrase generating means arranging the binary data received from the encoding module 330 into one data packet 220 comprising all data.

Figure 17A:
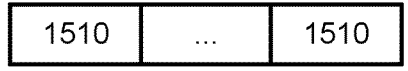
FIG. 17a-e are schematic views of different data packets according to embodiments of the invention.

In one embodiment of the generating module 340, the data packet 220, see FIG. 17a, comprises one or more blocks 1510 of encoded differential data. This embodiment has no overhead or metadata comprised in the data packet 220 and all parameters required in order to decode the data packet have to be either known, e.g. predetermined, or possible to recreate by the data decoding system 400.

Figure 17B:
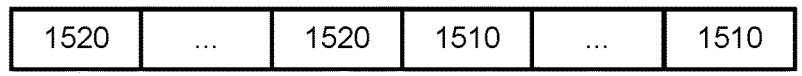

In a further embodiment of the generating module 340, the data packet 220, see FIG. 17b, comprises one or more blocks 1510 of encoded differential data and one or more k-parameters 1520 associated with the one or more blocks 1510 of encoded differential data.

Figure 17C:
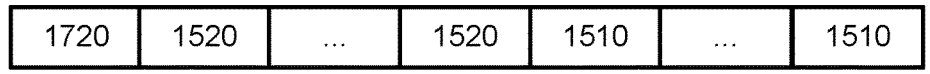

In a further embodiment of the generating module 340, the data packet 220, see FIG. 17c, also comprises a delta-coding iteration indicator 1720 that is indicative of the number of iterations the delta-coding has been performed by the pre-processing module 310.

Figure 17D:
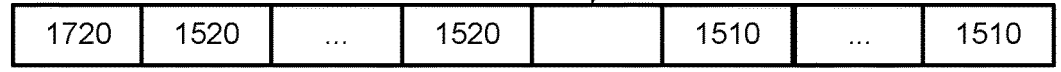

In a further embodiment of the generating module 340, the data packet 220, see FIG. 17d, comprises the first value 520 or the last differential value 540 as a separate data block. The separate data block may or may not be encoded.

Figure 17E:
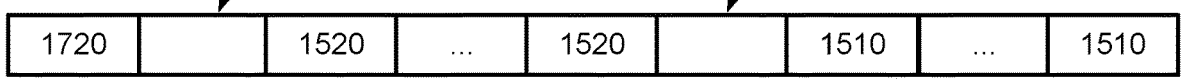

In a further embodiment of the generating module 340, the data packet 220, see FIG. 17e, comprises a block number indicator 1730 and/or one or more block length indicator 1740. These indicators indicate the number of blocks and/or the length of one or more blocks as provided by the dividing module 320.

In one embodiment, the delta-coding iteration indicator 1720 is represented using 4 bits. Each of the k-parameters 1520 is represented using 4 bits. The first value 520 is not encoded and represented by 16 bits.

In a further embodiment, the delta-coding iteration indicator 1720 is represented using 3 bits. Each of the k-parameters 1520 is represented using 4 bits. The last differential value 540 is un-encoded and represented by 16 bits. The block number indicator 1730 and/or the one or more block length indicators 1740 is represented by 2 bits.

The extracting module 440 works in much the reverse way of the generating module 340. The extracting module 440 extract the k-parameters 1520 from the data packet 220. If information such as the delta-coding iteration indicator 1720, the block number indicator 1730 and/or one or more block length indicators 1740 is provided in the data packet 220 to the extracting module 440, these parameters 1720, 1730, 1740 will also be extracted. The data packet 220 will typically be of a known format which means that the extracting module 440 knows the structure of the data packet 220 and can extract the data of the data packet accordingly. Alternatively, a header may be included in the data packet 220, which describes the structure of the data packet 220.

Note that the data packets 220 disclosed above are mainly for illustrative purposes. The data packet 220 may be construed in any suitable manner and e.g. the order of the data is irrelevant for the purpose of the invention. The different embodiments of the data packet 220 are possible to combine in any suitable way and the skilled person will, after digesting the content of this disclosure, understand how this is done and how it ties together with e.g. the data encoding system 300 and the data decoding system 400 and associated methods.

From the description of the modules, and how they are communicatively connected, the skilled person now realizes that the teachings herein can be applied to any series of data segments 210, regardless of length. If the series 210 of data segments are of a known characteristic, more data segment will typically imply a higher sample rate of the series 210 of data segments. Typically, the series 210 of data segments comprises data representing a FIR audio filter that is adapted for a hearing profile of a user. The longer the filter, the more correlation there will be between the bits and the pre-processing module 310 will generate a series 510 of differential data that has very low variance. Consequently, the encoding module 330 will work more efficiently and the overall compression ratio will increase.

It should be mentioned that the relation between the terms block 1310, 1510 of data, block 1310 of differential data and block 1510 of encoded differential data is such that the term block 1310, 1510 of data is to comprise any or both of the block 1310 of differential data or the block 1510 of encoded differential data. The reason is simply that the data packet 220 explained above may comprise one or more blocks 1510 of encoded differential data and none or more blocks 1310 of differential data wherein the term blocks 1310, 1510 of data comes handy.

Further to this, efficiency of a compression and its associated decompression algorithm may, in addition to the compression ratio, be evaluated by its resource consumption. Resource consumption may be e.g. memory consumption, number of processor operations necessary to complete it, consumption of current and/or energy etc. The invention presented herein is very efficient both from a compression ratio perspective due to the low overhead or metadata needed and from a resource consumption perspective. The teachings presented are implementable using simple arithmetic functions resulting in low requirements on any hardware used for implementing or executing software code implementing the modules 310, 320, 330, 340, 410, 420, 430, 440 above. This is especially beneficial when compression or decompression is to be performed by a system with limited resources, such as e.g. the headset 120 of FIG. 1. As mentioned earlier, both compression and decompression may be performed in either of the headset 120 or the mobile phone 110 in FIG. 1. This is possible due to the efficiency of the methodology taught herein.

Compression and Decompression Method

Figure 18:
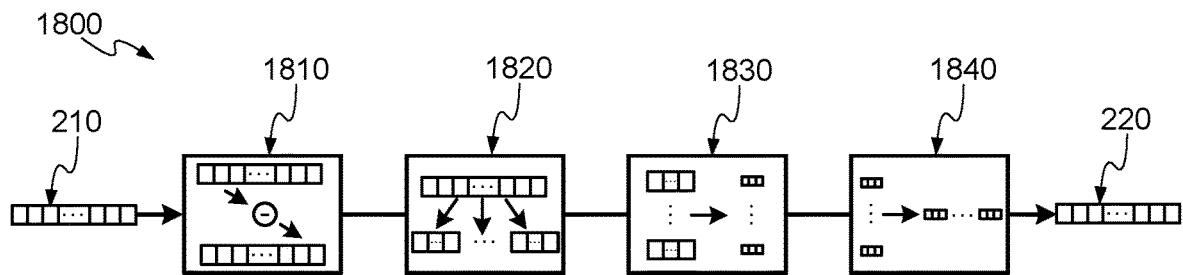
FIG. 18 is a block diagram of lossless data compression method according to embodiments of the invention.

Based on the presented modules and with reference to FIG. 18, a lossless data compression method 1800 will be presented. The method 1800 is suitable to be performed by the data encoding system 300 presented earlier. The method 1800 receives, by e.g. a pre-processing module 310, a series 210 of data segments. The series 210 of data segments is of a known length and of known characteristic. The known characteristic may comprise trends, amplitude, variation of variation across the series 210 of data segments (i.e. how the variation changes over the series 210 of data segments) etc.

The series 210 of data segments is pre-processed 1810, by e.g. the pre-processing module 310, generating a series 510 of differential data. The series 510 of differential data comprises a first value 520 and one or more differential values 530, 540. The pre-processing 1810 may be performed in any way as disclosed herein, e.g. in relation to the pre-processing module 310. The pre-processing 1810 may be an iterative process and the step of pre-processing may is such cases also provide a delta-coding iteration indicator 1720 indicating the number of iterations the pre-processing 1810 has been performed.

The method 1800 further comprises dividing 1820, by e.g. a dividing module 320, the series 510 of differential data into at least two blocks 1310 of differential data. The dividing 1820 may be performed in any way presented herein, e.g. in relation to the dividing module 320. The dividing may, depending on implementation, in addition to the at least two blocks 1310 of differential data also provide a block number indicator 1730 and/or one or more block length indicators 1740.

The method 1800 further comprises encoding 1830, by e.g. an encoding module 330, at least one of the at least two blocks 1310 of differential data using Rice-encoding. The step of encoding 1830 provides at least one block 1510 of encoded differential data. The step of encoding 1830 may further provide k-parameters 1520 for at least one of the blocks 1510 of encoded differential data. For the sake of clarity, this means that any number of blocks of differential data 1510 may be encoded with a predefined k-parameter 1520 that may or may not be provided by the step of encoding 1830, any number of blocks of differential data 1510 may be iteratively encoded as explained in previous sections and provided with associated k-parameters 1520 and any number, but not all, of the blocks of differential data may be left un-encoded. Further to this, the step of encoding 1830 may be performed in any way presented herein, e.g. in relation to the encoding module 330.

The method 1800 also comprises generating 1840, by e.g. the generating module 340, a data packet 220 comprising the blocks 1510 of encoded differential data and any blocks 1310 of differential data not having been encoded in the step of encoding 1830. The step of generating may further comprise including one or more k-parameters 1520 associated with one or more blocks 1510 of encoded differential data and/or any indicators associated with e.g. the steps of dividing 1820 or pre-processing 1810. In short, the step of generating 1840 may be performed in any way disclosed herein and can be configured to generate any of the data packets 210 mentioned herein.

Figure 19:
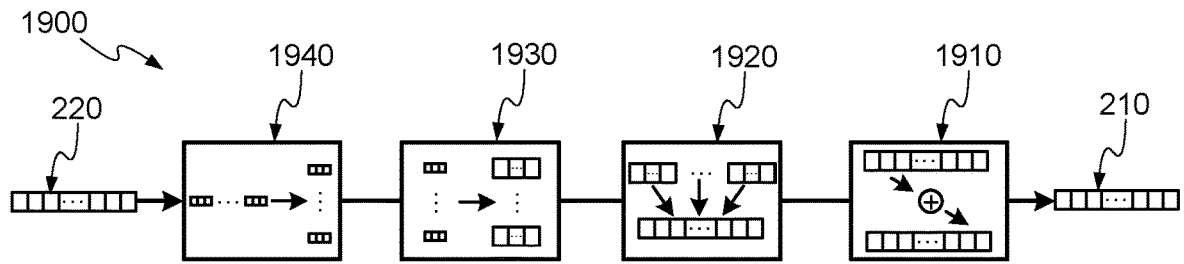
FIG. 19 is a block diagram of a lossless data decompression method according to embodiments of the invention.

Turning to FIG. 19, a lossless data decompression method 1900 will be explained. The method 1900 is suitable to be performed by the data decoding system 400 presented earlier. The method 1900 receives, by e.g. an extraction module 410, a data packet 220. The data packet 220 is a data packet 220 generated by the lossless data compression method 1800 presented earlier.

The method 1900 comprises extracting 1940, by e.g. the extracting module 440, one or more blocks of data wherein the blocks of data comprises at least one block 1510 of encoded differential data. The step of extracting 1940 may comprise extracting blocks of un-encoded differential data, one or more k-parameters associated with some or all of the extracted blocks 1510 of encoded differential data and/or extracting one or more indicators associated with e.g. the steps of dividing 1820 or pre-processing 1810 in the lossless data compression method 1800. The step of extracting 1940 may be performed in any way presented herein, e.g. in relation to the extracting module 440.

The lossless data decompression method 1900 further comprises decoding 1930, by e.g. the decoding module 430, the at least one block 1510 of encoded differential data, providing at least one block 1310 of differential data. The step of decoding may be provided with one or more k-parameters 1520 that are to be used for decoding 1930 but may also decode using predefined or configurable k-parameters 1520. The step of decoding 1930 may be performed in any way presented herein, e.g. in relation to the decoding module 430.

The method 1900 further comprises appending 1920, by e.g. an appending module 420, the one or more blocks 1310 of differential data and any blocks of un-encoded differential data to form a series 510 of differential data comprising a first value 520 and one or more differential values 530, 540. The step of appending 1920 may be performed in any way presented herein, e.g. in relation to the appending module 420.

The method 1900 also comprises the step of post-processing 1910, by e.g. the post-processing module, the series 510 of differential data to provide a series 210 of data segments. The step of post-processing 1910 uses the first value 520 and the differential values 530, 540 in the series 210 of data segments to generate the different data segments 230 in the series 210 of data segments. The step of post-processing 1910 may be performed in any way presented herein, e.g. in relation to the post-processing module 410.

Figure 20:
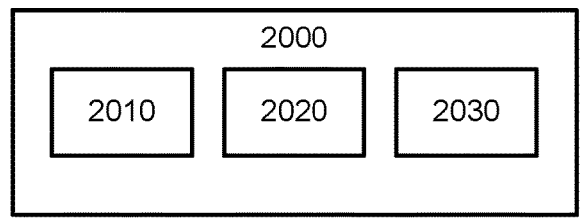
FIG. 20 is a block diagram of a portable electronic equipment according to embodiments of the invention.

Looking to FIG. 20, a portable electronic device 2000 is shown. The portable electronic device may comprise a controller 2010, a memory 2020 and a communications interface 2030. The controller 2010 may be configured to retrieve a hearing profile adapted for a user from the memory 2020, the hearing profile is represented by a series 210 of data segments. The controller 2020 may subject the hearing profile to the lossless data compression method 1800 presented earlier. The controller may further be configured to transmit the data packet 220 generated by the lossless data compression method 1800 to a second portable electronic device via the interface 2030. In some embodiments of the portable electronic device 2000, the portable electronic device 2000 is the mobile phone 110 of FIG. 1 and/or the second portable electronic device is the headset 120 of FIG. 1. In other embodiments, the portable electronic device 2000 is the headset 120 of FIG. 1 and/or the second portable electronic device is the mobile phone 110 of FIG. 1.

Figure 21:
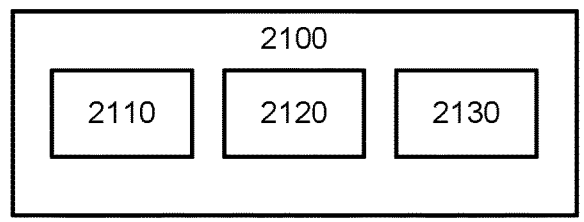
FIG. 21 is a block diagram of a portable electronic equipment according to embodiments of the invention.

In FIG. 21, a portable electronic device 2100 is presented. This portable electronic device 2100 may comprise a controller 2110, a memory 2120 and a communications interface 2130. The controller 2110 may be configured to receive a data packet 220 via the communications interface 2130 and subject the data packet to the lossless data decompression method 1900 presented earlier generating a series 210 of data segments. The series 210 of data segments may represent a hearing profile that may be associated with a user of the portable electronic device 2100. The controller 2110 may further be configured to store the hearing profile to the memory 2120. In some embodiments of the portable electronic device 2100, the portable electronic device 2100 is the headset 120 of FIG. 1. In other embodiments of the portable electronic device 2100, the portable electronic device 2100 is the mobile phone 110 of FIG. 1.

Figure 22:
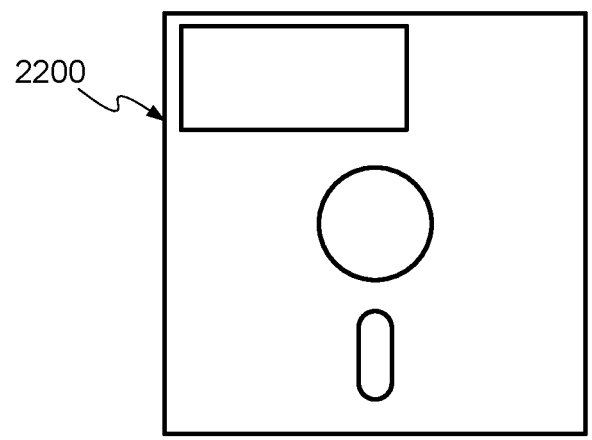
FIG. 22 is a schematic view of computer program product according to embodiments of the invention.

Presented in FIG. 22 is a computer program product 2200 configured such that when it is executed by a controller, the lossless data compression method 1800 is performed. The computer program product 2200 may, in some embodiments, be configured to implement part(s) of the method 1800 or one or more of the modules 310, 320, 330, 340 of the data encoding system 300.

Figure 23:
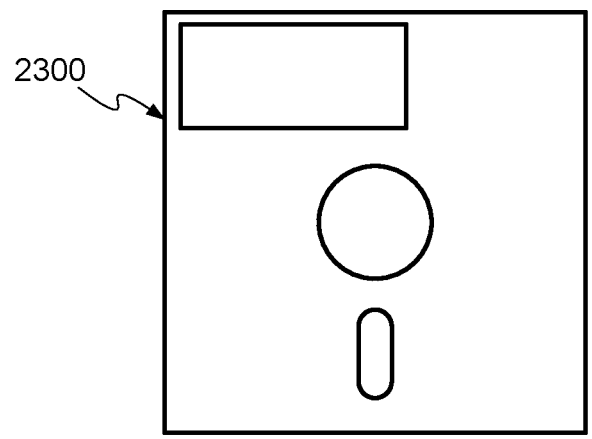
FIG. 23 is a schematic view of computer program product according to embodiments of the invention.

Presented in FIG. 23 is a computer program product 2300 configured such that when it is executed by a controller, the lossless data decompression method 1900 is performed. The computer program product 2300 may, in some embodiments, be configured to implement part(s) of the method 1900 or one or more of the modules 410, 420, 430, 440 of the data decoding system 400.

Figure 24:
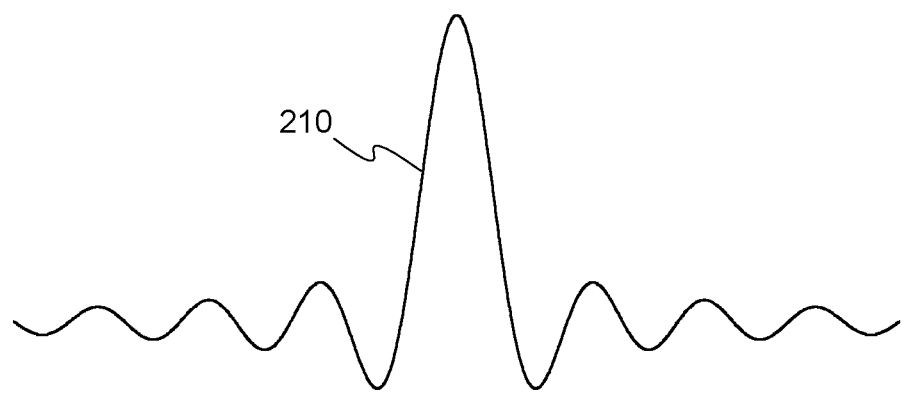
FIG. 24 is an exemplary series of data segments.
Figure 25A:
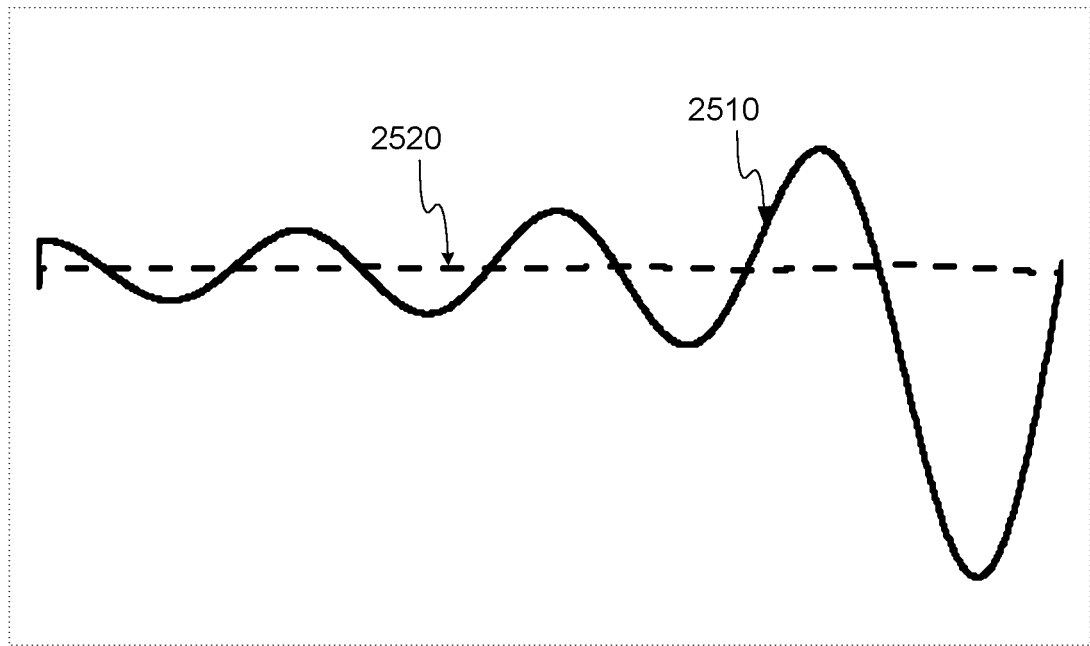
FIG. 25a-b are exemplary series of differential data after pre-processing according to embodiments of the invention.
Figure 25B:
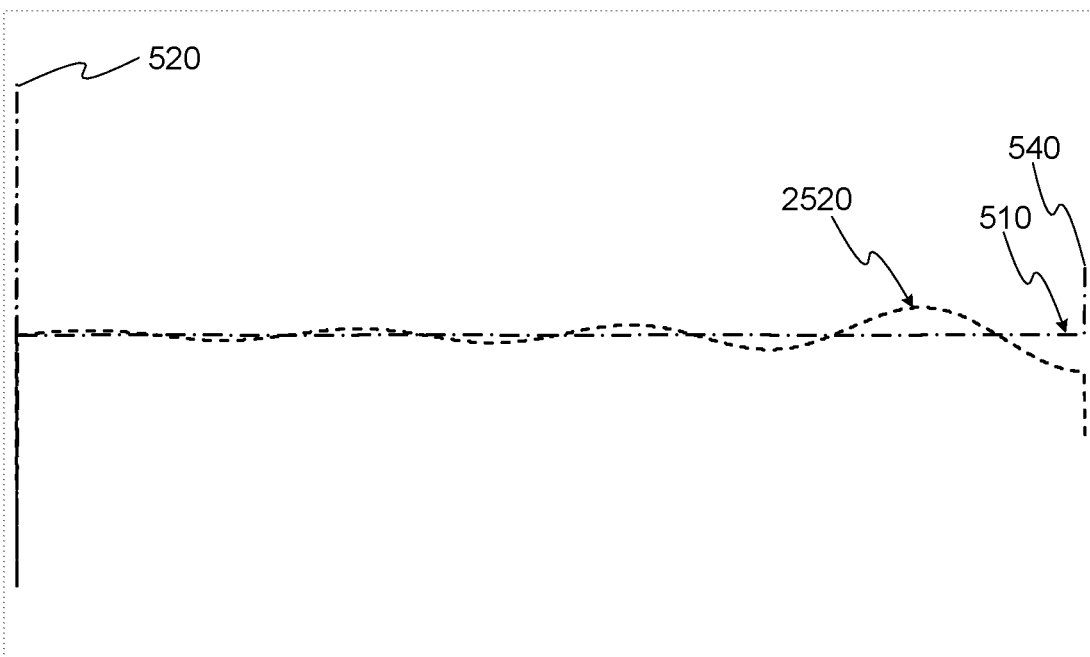

With reference to FIG. 24 and FIGS. 25*a-b*, an example will be shown of what the series 210 of data segments and the series 510 of differential data may look like. In FIG. 24 the time response of a low pass filter function, sin(x)/x [$-8\pi<x<8\pi$], is shown as the series 210 of data segments. Although the low pass filter function is sampled at a high sample rate generating a very smooth series 210 of data segments, the skilled person realizes that it is for explanatory purposes and that a more efficient sample rate may be chosen fulfilling at least the Nyquist-Shannon sampling theorem. As can be seen in FIG. 24 and which is known from the art, one characteristic of time domain filters is that they are mirrored around a center frequency. This means that only the first or the second half of the data needs to be part of the series 210 of data segments. The missing part is the mirror of the represented part and can be easily reproduced. Although not specifically mentioned, omitting and reproducing parts of the data series in this manner may be performed by e.g. the pre-processing module 310 and/or the post-processing module 410. Turning to FIG. 25*a*, the series 210 of data segments has been reduced to the first half of the series 210 of data segments in FIG. 24. This series 210 of data segments has been subjected to the pre-processing as described earlier in this disclosure. The solid line in FIG. 25*a* represents differential data 2510 after one iteration of delta-coding and the dashed line represents differential data 2520 after two iterations of delta-coding. For scaling reasons, the differential data 2520 after two iterations is presented with the series 510 of differential data in FIG. 25*b*. This is an effect of the delta-coding where the skilled person can grasp the difference in scale by comparing the plot of differential data 2520 after two iterations in FIG. 25*a* with differential data 2520 after two iterations in FIG. 25*b*. The series 510 of differential data corresponds to a third delta-coding iteration. As can be seen in FIG. 25*b*, both the first value 520 and the last differential value 540 stand out. Typically, In the case when the differential is an FIR audio filter, the last differential value 540 stand out more than the first value 520. For this reason, it is beneficial to separate this value from the other differential values 530 since it would increase the variance, the mean and increase the k-parameter 1520 provided from the encoding module 330.

It should be emphasized that the methods and devices disclosed herein have in some cases been described specifically for transferring of an audio profile between two portable electronic devices 110, 120. This is but one use of the inventive concept, the teachings may very well be used in one single electronic device, portable or not, to reduce the size of a series 210 of data segments in order to e.g. save storage space in the device. This means that the same electronic device would perform both compression and decompression. Consequently relating to compression, the series 210 of data segments may be received from any suitable storage means or through any suitable interface and output to any suitable storage means or through any suitable interface. Likewise, relating to decompression, the data packet 220 may be received from any suitable storage means or through any suitable interface and output to any suitable storage means or through any suitable interface.

Clauses

The scope of the invention is defined in the appended claims and the following clauses are to be considered exemplary embodiments of the invention.

Clause 1. A lossless data compression method (1800), the method (1800) comprising:
  receiving a series (210) of data segments of a known length and a known characteristic,
  pre-processing (1810) the series (210) of data segments to generate a series (510) of differential data comprising a first value (520), one or more differential values (530) and a last differential value (540),
  dividing (1820) the series (510) of differential data into at least two blocks (1310) of differential data,
  encoding (1830) at least one block (1310) of differential data using Rice encoding, thereby providing at least one block (1510) of encoded differential data, and
  generating (1840) a data packet (220) comprising said at least one block (1510) of encoded differential data and any blocks (1310) of differential data not having been encoded.

Clause 2. The method (1800) of clause 1, wherein in the step of generating (1840), the data packet (220) further comprises one or more k-parameters (1520) wherein each k-parameter (1520) is associated with a block (1510) of encoded differential data.

Clause 3. The method (1800) of clause 2, wherein the step of encoding (1830) further comprises Rice-encoding at least one block (1310) of differential data with an associated k-parameter (1520), wherein the k-parameter is determined by calculating an average number of bits of the differential values (530, 540) of the associated block (1310) of differential data.

Clause 4. The method (1800) of clause 2, wherein the step of encoding (1830) further comprises iteratively Rice-encoding each block (1310) of differential data with a predefined or configurable number of k-parameters (1520), and providing the shortest block (1510) of encoded differential data for each block (1310) of differential data to the step of generating (1840) together with the k-parameter (1520) associated with the shortest block (1510) of encoded differential data.

Clause 5. The method (1800) of any of the clauses 1 to 4, wherein, in the step of pre-processing (1810), the series (510) of differential data is generated by delta-coding of the series (210) of data segments one or more iterations.

Clause 6. The method (1800) of clause 5, wherein, in the step of generating (1840), the data packet (220) further comprises a delta-coding iteration indicator (1720), indicating the number of times each of the differential values (530) have been delta-coded.

Clause 7. The method (1800) of clause 6, wherein the pre-processing (1810) is repeated a number of iterations and each of the series (510) of differential data generated from each iteration of the pre-processing (1810) is subjected to the steps of diving (1820) and encoding (1830);
  the method (1800) further comprising, before the step of generating (1840): calculating a size of each series (1510) of encoded differential data and using the series (1510) of encoded differential data of smallest size in the step of generating (1840).

Clause 8. The method (1800) of any of the clauses 5-7, wherein the delta-coding is repeated a preset or configurable number of iterations, wherein the number of iterations is between 2 and 10, preferably between 3 and 7 and most preferably 4 or 5.

Clause 9. The method (1800) of clause 6, wherein the delta-coding is repeated until the variance of the differential values (530) is minimized or below a predefined or configurable variance threshold.

Clause 10. The method (1800) of clause 6, wherein the delta-coding is repeated until the sum of absolute values of the differential values (530) is minimized or below a predefined or configurable average threshold.

Clause 11. The method (1800) of any of the clauses 6, 7, 9 or 10, wherein the delta-coding is repeated for a maximum of a predefined or configurable number of iterations.

Clause 12. The method (1800) of clause 11, wherein the maximum iterations is 6.

Clause 13. The method (1800) of any of the preceding clauses, wherein, in the step of dividing (1820), the number of blocks of differential data is a predefined or configurable number.

Clause 14. The method (1800) of any of the preceding clauses, wherein, in the step of dividing (1820), the series (510) of differential data is divided into a total of 4 blocks (1310) of differential data.

Clause 15. The method (1800) of any of the preceding clauses, wherein, in the step of generating (1840), the data packet (220) further comprises a block number indicator (1730) indicating the number of blocks of differential data the series (510) of differential data is divided into.

Clause 16. The method (1800) of any of the preceding clauses, wherein, in the step of generating (1840), the data packet (220) further comprises at least one block length indicator (1740) associated with at least one of the blocks which the series (510) of differential data is divided into.

Clause 17. The method (1800) of any of the preceding clauses, wherein, in the step of generating (1840), the data packet (220) further comprises one block length indicator (1740) associated with each block (1510) of encoded differential data and any blocks (1310) of differential data comprised in the data packet (220).

Clause 18. The method (1800) of any of the clauses 14-16, wherein, in the step of dividing (1820), the number of blocks is adaptively determined by iteratively calculating a minimum variance.

Clause 19. The method (1800) of any of the preceding clauses, wherein the series (510) of differential data is divided into blocks of equal length.

Clause 20. The method (1800) of any of the clauses 1-18, wherein at least two of the blocks (1310) of differential data are of different length.

Clause 21. The method (1800) of clause any of the preceding clauses, wherein one block (1310) of differential data has a length of one.

Clause 22. The method (1800) of any of the preceding clauses, wherein, in the step of dividing (1820), one block (1310) of differential data contains only the last differential value (540) and the differential values (530) and the first value (520) are comprised in at least one other block (1310) of differential data.

Clause 23. The method (1800) of any of the preceding clauses, wherein the step of encoding (1830) comprises not encoding the block (1310) of differential data comprising the last differential value (540).

Clause 24. The method (1800) of any of the preceding clauses, wherein the series (210) of data segments contains 32 segments.

Clause 25. The method (1800) of any of the preceding clauses, wherein the characteristics of the series (210) of data segments is that of a digital filter.

Clause 26. The method (1800) of clause 25, wherein the digital filter is a FIR audio filter.

Clause 27. The method (1800) of any of the preceding clauses, wherein the series (210) of data segments describe a personal hearing profile associated with a user.

Clause 28. The method (1800) of clause 27, wherein the hearing profile is adapted for use in a headset (120).

Clause 29. A lossless data decompression method (1900) for decompressing a data packet (220) generated by the lossless data compression method (1800) of any of clauses 1 to 29, the method (1900) comprising:
- extracting (1940) blocks of data (1310, 1510) form the data packet (220) wherein at least one block (1310, 1510) of data is a block (1510) of encoded differential data,
- decoding (1930) the at least one block (1510) of encoded differential data, providing one or more blocks (1310) of differential data,
- appending (1920) the one or more blocks (1310) of differential data into one series (510) of differential data comprising a first value (520), a series (530) of differential data and a last differential value (540), and
- post-processing (1910) the series (510) of differential data based on the first value (520) to provide a series (210) of data segments.

Clause 30. The method (1900) of clause 29, wherein
- the data packet (220) further comprises one or more k-parameters (1520) wherein each k-parameter (1520) is associated with a block (1510) of encoded differential data,
- the step of extracting (1940) comprises extracting said one or more k-parameters (1520) from the data packet (220), and
- the step of decoding (1920) further comprises decoding blocks (1510) of encoded differential data using their associated k-parameters (1520).

Clause 31. The method (1900) of any of the clauses 29 or 30, wherein:
- the series (510) of differential data comprised in the data packet (220) was generated by delta-coding of the series (210) of data segments one or more times, and
- the step of post-processing (1910) comprises delta-decoding the series (510) of differential data one or more times.

Clause 32. The method (1900) of any of the clauses 29 to 31, wherein:
- the data packet (220) further comprises a delta-coding iteration indicator (1720), indicating the number of times each of the differential values (530) in the data packet (220) was delta-coded,
- the step of extracting (1940) further comprises extracting, from the data packet (220), the delta-coding iteration indicator (1720), and
- the step of post-processing (1910) is run the same number of times as indicated by the delta-coding iteration indicator (1720).

Clause 33. The method (1900) of any of the clauses 29 to 32, wherein
- the series 510 of differential data (210) comprised in the data packet (220) was repeatedly delta-coded a preset or configurable number of times, wherein the number of times is between 2 and 10, preferably between 3 and 7 and most preferably 4 or 5,
- the step of post-processing (1910) is run a the preset or configurable number of times.

Clause 34. The method (1900) of any of clauses 29 to 33, wherein
- the blocks of data (1310, 1510) comprised in the data packet is a predefined or configurable number of blocks,
- the steps of extracting (1940) further comprises extracting the predefined or configurable number of blocks.

Clause 35. The method (1900) of clause 34, wherein the predefined or configurable number of blocks is 4.

Clause 36. The method (1900) of any of clauses 29 to 35, wherein
- the data packet (220) further comprises a block number indicator (1730) indicating the number of blocks of differential data the series (510) of differential data is divided into, and
- the step of extracting (1940) further comprises extracting the block number indicator (1730) from the data packet (220) and extracting, from the data packet (220), the same number of blocks of data as indicated by the block number indicator (1730).

Clause 37. The method (1900) of any of clauses 29 to 36, wherein
- the data packet (220) further comprises at least one block length indicator (1740) associated with at least one of the blocks of data (1310, 1510) which the series (510) of differential data is divided into, and
- the step of extracting (1940) further comprises extracting at least one block length indicator (1740) and using the block length indicator (1740) to extract said one or more blocks of data (1310, 1510) from the data packet (220).

Clause 38. The method (1900) of any of clauses 29 to 37, wherein
- one block (1310) of differential data comprised in the data packet (220) contains only the last differential value (540) and the differential values (530) are comprised in at least one other block (1310) of differential data of the data packet (220), and
- the step of extracting (1940) further comprises extracting one block (1310, 1510) of data containing the last differential value (540) and at least one other block (1310, 1510) of data comprising one or more differential values (530) and the first value (520).

Clause 39. The method (1900) of any of clauses 29 to 38, wherein
- the series (510) of differential data comprised in the data packet (220) is divided into a total of 4 blocks (1310, 1510) of differential data, and
- the step of extracting (1940) further comprises extracting a total of four blocks of data (1310, 1510).

Clause 40. The method (1900) of any of clauses 29 to 39, wherein
- the block (1310) of differential data comprising the last differential value (540) comprised in the data packet (220) is not encoded, and the step of decoding (1920) is not applied to the block (1310) of data comprising the last differential value (540).

Clause 41. A portable electronic device comprising a controller, a memory and a communications interface, wherein the controller is configured to retrieve a hearing profile adapted for a user from the memory and subject the hearing profile to the method of any of clauses 1 to 31 to generate a compressed data packet, wherein the controller is further configured to transmit the compressed data packet to a second portable electronic device via the interface.

Clause 42. The portable electronic device of clause 41, wherein the portable electronic device is a mobile phone.

Clause 43. A portable electronic device comprising a controller, a memory and a communications interface, wherein the controller is configured to receive a compressed data packet via the communications interface and subject the data packet to the method of any of clauses 32 to 43 to generate a series (210) of data segments wherein the controller is further configured to store the provided series (210) of data segments to the memory as a hearing profile.

Clause 44. The portable electronic device of clause 43, wherein the portable electronic device is a headset.

Clause 45. A computer program product configured to, when executed by a controller, perform the method of any of clauses 1 to 28.

Clause 46. A computer program product configured to, when executed by a controller, perform the method of any of clauses 29 to 40.

The invention claimed is:

1. A lossless data compression method, the method comprising:
   receiving a series of data segments of a known length and a known characteristic,
   pre-processing the series of data segments to generate a series of differential data comprising a first value, one or more differential values (530) and a last differential value, by repeated delta-coding of the series of data segments until a sum of absolute values of the differential values is minimized or below a predefined or configurable average threshold,
   dividing, based on the known characteristic, the series of differential data into at least two blocks of differential data,
   encoding at least one block of differential data using Rice encoding, thereby providing at least one block of encoded differential data, and
   generating a data packet comprising said at least one blocks of encoded differential data, at least one block of differential data not having been encoded and a delta-coding iteration indicator, indicating the number of times each of the differential values have been delta-coded.

2. The method of claim 1, wherein the known characteristic of the series of data segments is that a variance at one end of the series of data segments is higher than a variance at the other end of the series of data segments.

3. The method of claim 1, wherein in the step of generating, the data packet further comprises one or more k-parameters wherein each k-parameter is associated with a block of encoded differential data.

4. The method of claim 3, wherein the step of encoding further comprises Rice-encoding at least one block of differential data with an associated k-parameter, wherein the k-parameter is determined by calculating an average number of bits of the differential values of the associated block of differential data.

5. The method of claim 1, wherein, in the step of dividing, one block of differential data contains only the last differential value and the differential values and the first value are comprised in at least one other block of differential data.

6. The method of claim 1, wherein the step of encoding comprises not encoding the block of differential data comprising the last differential value.

7. The method of claim 1, wherein the characteristics of the series of data segments is that of a digital FIR audio filter.

8. A portable electronic device comprising a controller, a memory and a communications interface, wherein the controller is configured to retrieve a hearing profile adapted for a user from the memory and subject the hearing profile to the lossless data compression method of claim 1 to generate a data packet, wherein the controller is further configured to transmit the data packet to a second portable electronic device via the interface.

9. A computer program product configured to, when executed by a controller, perform the lossless data compression method of claim 1.

10. A lossless data decompression method for decompressing a data packet generated by the lossless data compression method of claim 1, the method comprising:
    extracting blocks of data from the data packet wherein at least one block of data is a block of encoded differential data, at least one block of un-encoded differential data, and a delta-coding iteration indicator, indicating the number of times each of the differential values in the data packet was delta-coded,
    decoding the at least one block of encoded differential data, providing one or more blocks of differential data,
    appending the one or more blocks of differential data into one series of differential data comprising a first value, a series of differential data and a last differential value, and
    post-processing the series of differential data based on the first value by delta-decoding the series of differential data the same number of times as indicated by the delta-coding iteration indicator to generate a series of data segments.

11. The method of claim 10, wherein
    the data packet further comprises one or more k-parameters wherein each k-parameter is associated with a block of encoded differential data,
    the step of extracting comprises extracting said one or more k-parameters from the data packet, and
    the step of decoding further comprises decoding blocks of encoded differential data using their associated k-parameters.

12. The method of claim 10, wherein
    one block of differential data comprised in the data packet contains only the last differential value and the differential values are comprised in at least one other block of differential data of the data packet, and
    the step of extracting further comprises extracting one block of data containing the last differential value and at least one other block of data comprising one or more differential values and the first value.

13. The method of claim 10, wherein
    the block of differential data comprising the last differential value comprised in the data packet is one of said at least one block of un-encoded differential data, and
    the step of decoding is not applied to the block of data comprising the last differential value.

14. A portable electronic device comprising a controller, a memory and a communications interface, wherein the controller is configured to receive a data packet via the communications interface and subject the data packet to the lossless data decompression method of claim 10, to generate a series of data segments, wherein the controller is further configured to store the series of data segments to the memory as a hearing profile.

15. A computer program product configured to, when executed by a controller, perform the lossless data decompression method of claim 10.

\* \* \* \* \*